US012676624B2

(12) United States Patent
    Sen et al.

(10) Patent No.:    US 12,676,624 B2
(45) Date of Patent:        Jul. 7, 2026

(54) SELF-CALIBRATING DELAY LINE FLASH ADC AND TRACKING CIRCUITRY

(71) Applicant: Infineon Technologies Austria AG, Villach (AT)

(72) Inventors: Sujata Sen, Marina Del Rey, CA (US); Luca Petruzzi, El Segundo, CA (US)

(73) Assignee: Infineon Technologies Austria AG, Villach (AT)

( * ) Notice: Subject to any disclaimer, the term of this patent is extended or adjusted under 35 U.S.C. 154(b) by 140 days.

(21) Appl. No.: 18/636,667

(22) Filed: Apr. 16, 2024

(65) Prior Publication Data

US 2025/0323653 A1      Oct. 16, 2025

(51) Int. Cl.
    H03M 1/10          (2006.01)
    H03M 1/12          (2006.01)
    H03M 1/50          (2006.01)

(52) U.S. Cl.
    CPC ....... H03M 1/1014 (2013.01); H03M 1/1255 (2013.01); H03M 1/504 (2013.01)

(58) Field of Classification Search
    CPC ... H03M 1/504; H03M 1/1014; H03M 1/1225
    See application file for complete search history.

(56)                References Cited

U.S. PATENT DOCUMENTS 6,437,553  B1 *   8/2002   Maloney ................ H03K 5/133
                                                      324/76.35
    6,882,146  B2 *   4/2005   Maiwald .............. G01R 33/093
                                                      324/225

7,760,124  B2 *   7/2010   Trescases .............. G04F 10/005
                                                      327/295
    9,000,962  B1 *   4/2015   Leuciuc .............. H03M 1/0836
                                                      341/120
    9,148,161  B2 *   9/2015   Siragusa ............. H03M 1/1009
    9,184,759  B1 *  11/2015   Yu ........................ H03M 1/1095
    9,989,928  B2 *   6/2018   Wu ........................ G04F 10/005
    10,298,247 B1 *   5/2019   Frew .................. H03M 1/0624
    10,601,434 B1 *   3/2020   Molina .............. H03M 1/1009
    11,349,474 B1 *   5/2022   Yelamos Ruiz ..... G01R 19/145
    2005/0062482 A1 *  3/2005   Vincent ................ H03M 1/502
                                                      324/617
    2006/0017599 A1 *  1/2006   Elbornsson ......... H03M 1/0624
                                                      341/155
    2006/0284750 A1 * 12/2006   Keskin ............... H03M 1/0604
                                                      341/120

(Continued)

*Primary Examiner* — Lam T Mai
(74) *Attorney, Agent, or Firm* — Armis IP Law, LLC

(57)                ABSTRACT

An apparatus as discussed herein can be configured to include a delay line analog-to-digital converter operable to convert an analog error voltage into a digital error voltage signal. Additionally, the apparatus can be configured to include an integrator function as well as a digital to analog converter. The integrator function is operable to produce a digital value representative of an analog input voltage, the digital value adjusted based on samples of the digital error voltage signal generated by the delay line analog-to-digital converter. The digital-to-analog converter operative to convert the digital value received from the integrator function into a second analog voltage, the analog error voltage being a difference between the input voltage and the second analog voltage.

27 Claims, 26 Drawing Sheets

(56) References Cited

U.S. PATENT DOCUMENTS

| | | | | |
|---|---|---|---|---|
| 2010/0066422 A1* | 3/2010 | Tsai | H03K 5/133 | |
| | | | | 327/163 |
| 2013/0106630 A1* | 5/2013 | Wong | H03M 1/46 | |
| | | | | 341/110 |
| 2014/0233289 A1* | 8/2014 | Zhao | H02M 7/53875 | |
| | | | | 363/131 |
| 2015/0100264 A1* | 4/2015 | Qian | H02P 21/18 | |
| | | | | 324/202 |
| 2016/0149582 A1* | 5/2016 | Ragab | H03M 1/121 | |
| | | | | 341/120 |
| 2017/0134015 A1* | 5/2017 | Papananos | H03K 5/14 | |
| 2017/0134194 A1* | 5/2017 | Papananos | H04L 27/18 | |
| 2017/0294921 A1* | 10/2017 | Kris | H03M 1/1028 | |
| 2019/0207620 A1* | 7/2019 | Lee | H03M 3/494 | |
| 2019/0326919 A1* | 10/2019 | Pernull | H03M 1/1071 | |
| 2020/0319234 A1* | 10/2020 | Musunuri | G01R 19/252 | |
| 2023/0253976 A1* | 8/2023 | Whitcombe | H03M 1/1023 | |
| | | | | 341/120 |
| 2023/0327680 A1* | 10/2023 | Xu | H03M 1/468 | |
| 2024/0413844 A1* | 12/2024 | Nielsen | H03M 3/454 | |
| 2025/0105856 A1* | 3/2025 | Ortmanns | H03M 3/424 | |
| 2025/0323655 A1* | 10/2025 | Sen | H03M 1/1028 | |

* cited by examiner

FIG. 21B

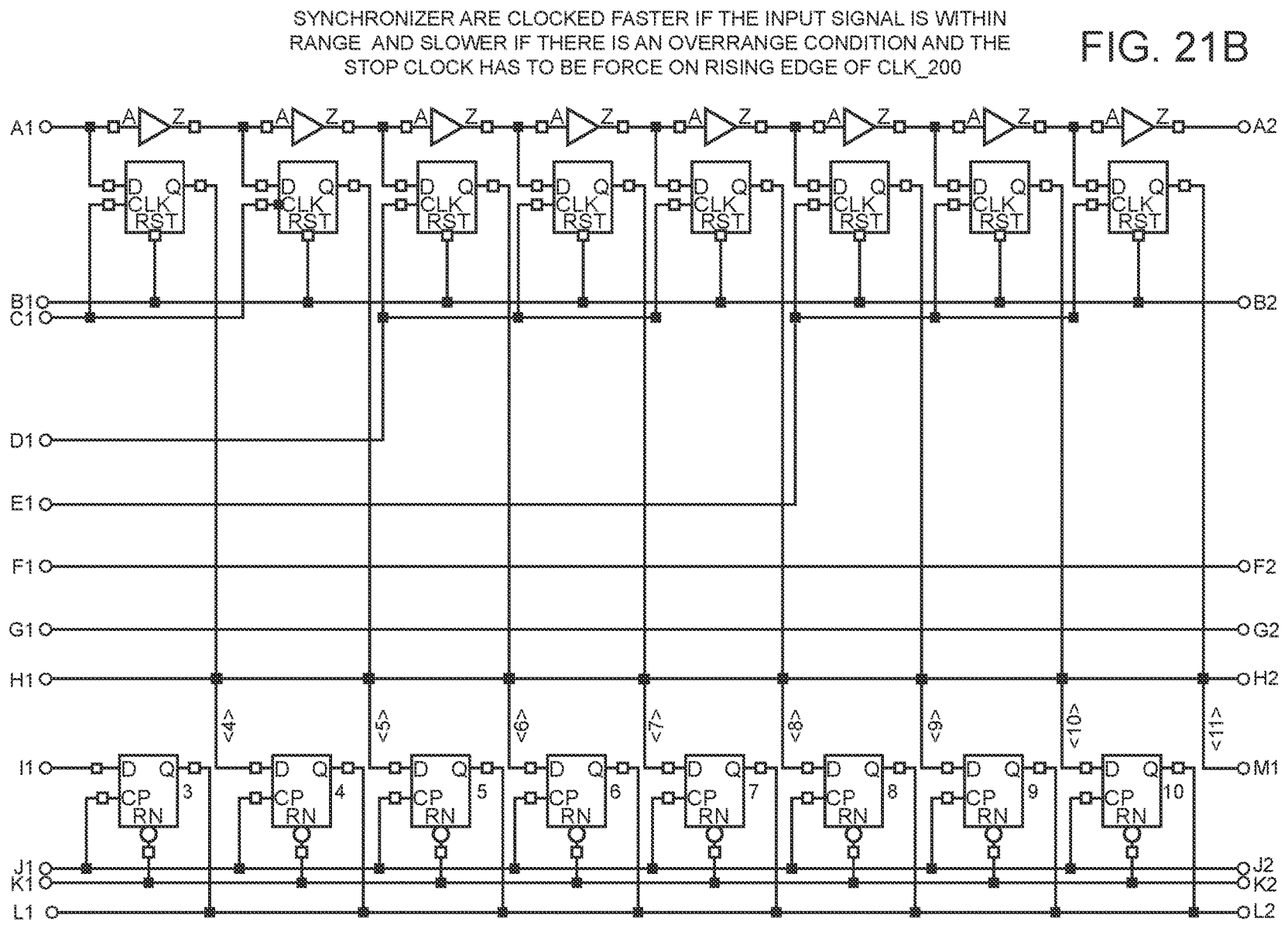

SYNCHRONIZER ARE CLOCKED FASTER IF THE INPUT SIGNAL IS WITHIN RANGE AND SLOWER IF THERE IS AN OVERRANGE CONDITION AND THE STOP CLOCK HAS TO BE FORCE ON RISING EDGE OF CLK_200

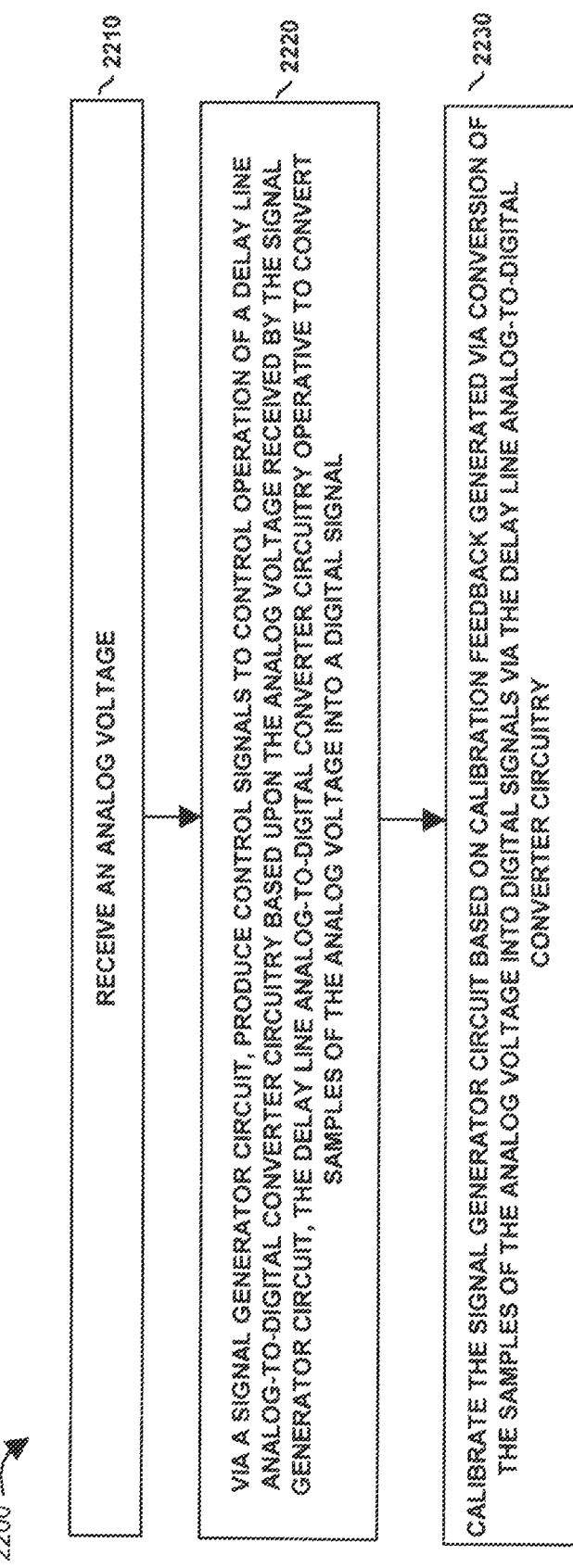

2200

2210

RECEIVE AN ANALOG VOLTAGE

2220

VIA A SIGNAL GENERATOR CIRCUIT, PRODUCE CONTROL SIGNALS TO CONTROL OPERATION OF A DELAY LINE ANALOG-TO-DIGITAL CONVERTER CIRCUITRY BASED UPON THE ANALOG VOLTAGE RECEIVED BY THE SIGNAL GENERATOR CIRCUIT, THE DELAY LINE ANALOG-TO-DIGITAL CONVERTER CIRCUITRY OPERATIVE TO CONVERT SAMPLES OF THE ANALOG VOLTAGE INTO A DIGITAL SIGNAL

2230

CALIBRATE THE SIGNAL GENERATOR CIRCUIT BASED ON CALIBRATION FEEDBACK GENERATED VIA CONVERSION OF THE SAMPLES OF THE ANALOG VOLTAGE INTO DIGITAL SIGNALS VIA THE DELAY LINE ANALOG-TO-DIGITAL CONVERTER CIRCUITRY

FIG. 22

SELF-CALIBRATING DELAY LINE FLASH ADC AND TRACKING CIRCUITRY

BACKGROUND

A conventional tracking-ADC (analog-to-digital converter) can be used to convert an input voltage into a respective digital signal indicating a magnitude of the input voltage. In general, the conventional tracking-ADC is operative to compare an analog input voltage with its digital-to-analog (D/A) converted digital output.

For example, a conventional tracking-ADC can be configured to include a digital-to-analog converter. The digital-to-analog converter receives the digital output of the conventional tracking ADC. Based on the received digital output, the digital-to-analog converter converts the digital output into a corresponding analog signal representing the digital output. The conventional tracking-ADC can be configured to further include a difference function that produces an error signal representing a difference between the analog input voltage (being converted) and the corresponding analog signal generated by the digital-to-analog converter. The conventional tracking-ADC includes analog-to-digital converter function that converts the analog error signal into a respective digitized version of the error signal. Based on the digitized error signal, the conventional tracking-ADC produces the respective digital output representative of the input voltage.

The above loop associated with the conventional tracking analog-to-digital converter ensures that the digital output representative of the input voltage is very accurate.

BRIEF DESCRIPTION

Implementation of clean energy (or green technology) is very important to reduce human impact on the environment. In general, clean energy includes any evolving methods and materials to reduce an overall toxicity on the environment from energy consumption.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, wireless base stations, etc. In certain instances, energy is stored in a respective one or more battery resource. Alternatively, energy is received from a voltage generator or voltage source.

Regardless of whether energy is received from green energy sources or non-green energy sources, it is desirable to make most efficient use of raw energy (such as storage and subsequent distribution) provided by such sources to reduce our impact on the environment. This disclosure contributes to reducing our carbon footprint and providing better use of energy via more efficient energy conversion.

As previously discussed, a conventional tracking ADC can be configured to subtract the input analog signal from an analog output signal of a DAC to create an analog error voltage. The DAC stores the previous cycle value of the ADC output—this error voltage is digitized by a comparator which determines whether the step size is added or subtracted from the DAC for the next cycle.

Note that a conventional Tracking ADC has limitations. For example, a tracking ADC can be used as a current sensor ADC (a.k.a. ISADC), but has the following advantages/disadvantages Tracking ADC advantages:
  Low power
  High sampling rate
  Single cycle conversion
Tracking ADC Disadvantages
  But can only digitize low bandwidth signals
  Tracking loop can only step as fast as the step size which is controlled by the resolution/range of the error quantizer This disclosure further includes the observation that it is desirable to design a current sensor ADC that tracks higher speed transients as power supply inductor values keep shrinking and switching frequency of a respective power converter keeps increasing for new power converter products. Also, a new application of LLC type resonant converters may require ISADC to track 1 Mhz sine wave shaped currents. In addition, the LLC regulator topologies may require precise detection of when the switch currents cross zero in order to have the advantage of higher efficiency due to 'Zero Volt Switching' control methods.

A conventional tracking ADC would have issues tracking a signal having a fast slew rate. To track faster slew rates requires a larger error quantizer (such as a function converting the generated analog error signal into the corresponding digital error signal). Prior versions of an ISADC (a.k.a., current sensing analog-to-digital converter) may include multiple comparators to convert a respective error signal into a digitized error signal, which requires multiple preamplifiers and multiple latches which undesirably consumes large area and consumes a higher amount of power. In addition, the multiple comparators in a conventional tracking-ADC may create a large load at the output of the tracking loop which degenerates the bandwidth of the tracking loop (settling time of Verror). The techniques including circuitry and methods as discussed herein address one or more of these shortcomings.

More specifically, an apparatus or system as discussed herein includes delay line analog-to-digital converter circuitry, a signal generator circuit, and calibration circuitry. The signal generator circuit (such as a voltage to time converter or other suitable entity) may be coupled to the delay line analog-to-digital converter circuitry. The signal generator circuit can be configured to produce control signals to control operation of the delay line analog-to-digital converter circuitry based upon an analog voltage received by the signal generator circuit for conversion into a digital signal. Further, the calibration circuitry as discussed herein can be configured to calibrate the signal generator circuit based on calibration feedback (such as from monitoring the delay line analog-to-digital converter circuitry and/or the signal generator circuit) to ensure accurate operation of converting instances of the received analog voltage into a respective samples of the digital signal.

In one example, the delay line analog-to-digital converter circuitry includes a first delay line analog-to-digital converter circuit and a second delay line analog-to-digital converter disposed in parallel to convert the received analog voltage into corresponding samples of digital output signals.

In accordance with another example as discussed herein, the delay line analog-to-digital converter circuitry can be configured to include: a first delay line analog-to-digital converter operative to generate positive polarity error values associated with conversion of the received analog voltage into the digital signal; and a second delay line analog-to-digital converter operative to generate negative polarity error values associated with conversion of the received analog voltage into the digital signal.

Yet further as discussed herein, the received analog voltage can be supplied by a selector circuit (such as a multiplexer circuit coupled to the signal generator) where different types of analog voltage signals are inputted to the signal generator circuit for conversion into respective samples of the digital signal. One or more of the different types of analog voltage signals can be used to support calibration as discussed herein.

In yet another example, a first delay line analog-to-digital converter circuit of the delay line analog-to-digital converter circuitry is operative to generate a first portion of the corresponding samples for a first operational condition in which the analog voltage is greater than a threshold level (such as 0 volts or other suitable value); and a second delay line analog-to-digital converter circuit of the delay line analog-to-digital converter circuitry is operative to generate a second portion of the corresponding samples during a second operational condition in which the analog voltage is less than the threshold level.

Note further that the control signals as discussed herein can be configured to include a first control signal and a second control signal. The first control signal can be configured to control a start operation of the first delay line analog-to-digital converter circuit; the second control signal can be configured to control a stop operation of the first delay line analog-to-digital converter circuit. The second control signal can be configured to control a start operation of the second delay line analog-to-digital converter circuit; the first control signal can be configured to control a stop operation of the second delay line analog-to-digital converter circuit.

In accordance with still further examples as discussed herein, the apparatus can be configured to include selector circuitry operative to select between a first output signal generated by the first delay line analog-to-digital converter circuit and a second output signal generated by the second delay line analog-to-digital converter circuit. The calibration circuitry can be configured to use the first signal and the second signal as a basis in which to calibrate the signal generator circuitry and/or the delay line analog-to-digital converter circuitry.

Yet further examples as discussed herein include implementation of the delay line analog-to-digital converter circuitry in a tracking analog-to-digital converter circuit. The calibration circuitry can be configured to include a gain calibration loop where a gain associated with the delay line analog-to-digital converter circuitry is configured to match a gain setting of a tracking loop associated with a tracking analog-to-digital converter circuit.

Still further, note that the signal generator circuit such as voltage to time converter can be configured to include an amplifier operative to receive the analog voltage. The calibration circuitry as discussed herein can be configured to include an offset calibration circuit operative to monitor the control signals outputted from the signal generator and inputted to the delay line analog-to-digital converter circuitry. The offset calibration circuitry further can be configured to generate an offset adjustment control signal based on the monitored control signals inputted to the delay line analog-to-digital converter circuitry. The offset adjustment control signal adjusts an offset associated with the amplifier. In one example, the offset calibration circuitry is an offset delay locked loop circuit or other suitable entity operative to produce the offset adjustment control signal supplied to the amplifier.

In yet further examples, the signal generator circuit such as voltage to time converter may include an amplifier operative to receive the analog voltage. The calibration circuitry can be configured to include a gain calibration circuit operative to monitor an output of the delay line analog-to-digital converter circuitry. The gain calibration circuitry can be configured to generate a gain adjustment control signal based on the output of the delay line analog-to-digital converter circuitry, where the generated gain adjustment control signal adjusts a gain associated with the amplifier subsequently converting further samples of the received analog voltage into the control signals. The offset calibration circuitry can be configured as a gain delay locked loop circuit or other suitable entity.

In a further example, the signal generator circuit as discussed herein is a voltage-to-time converter operative to produce a start signal and a stop signal supplied to the delay line analog-to-digital converter circuitry where a magnitude of a time duration between the start signal and the stop signal depends on or proportionally tracks a magnitude of the received analog voltage. The calibration circuitry can be configured to calibrate the voltage-to-time converter based on the calibration feedback in a manner as previously discussed.

Yet further, the apparatus as discussed herein can be configured to include a selector circuit (such as a pre-stage with respect to the voltage to time converter) operative to select amongst multiple analog inputs as the analog voltage inputted to the signal generator. For example, the selector circuit can be configured to select amongst: i) a first analog gain reference voltage, ii) a second analog gain reference voltage, iii) an offset reference voltage, and iv) and the analog error voltage. The signals including i) a first analog gain reference voltage, ii) a second analog gain reference voltage, iii) an offset reference voltage, etc., can be used for calibration purposes.

The analog voltage received and converted into the digital signal as discussed herein can be: i) a first analog gain reference voltage, ii) a second analog gain reference voltage, iii) an offset reference voltage, or iv) the analog error voltage. In one example, the calibration circuitry is operative to produce the calibration adjustment signals such as calibration feedback as discussed herein based on analog-to-digital conversions of the first analog gain reference voltage, the second analog gain reference voltage, and the offset reference voltage at different times during an analog-to-digital converter cycle.

Still further, the selector circuit (such as pre-stage with respect to the voltage to time converter) can be configured to interleave conversion of the received analog voltage such as an analog error voltage (or other signal of interest) amongst conversions of the first analog gain reference voltage, the second analog gain reference voltage, and the offset reference voltage. In other words, conversion of the first analog gain reference voltage, the second analog gain reference voltage, and the offset reference voltage supports calibration of the signal generator circuit for purposes of subsequently providing analog-to-digital conversion of the signal of interest (such as the error voltage or other suitable voltage being converted). In such an example, the analog-to-digital converter circuit and/or the signal generator circuit as discussed herein can be constantly calibrated (such as in a cycle) in between instances of converting the analog error voltage into respective samples of the digital signal. The constant or repetitive function of calibrating the analog-to-digital converter (including the signal generator and/or the delay line analog-to-digital converter circuitry) cycle over cycle ensures that the respective samples of the digital signal representing the analog error voltage are as accurate as possible.

Yet further, an example of the apparatus includes a synchronizer circuit. The synchronizer circuit as discussed herein is operative to adjust a clock signal applied to D flip-flops disposed in the delay line analog-to-digital converter circuitry.

Yet further, examples herein include a method apparatus comprising: receiving an analog voltage; via a signal generator circuit such as a voltage to time converter or other suitable entity, producing control signals to control operation of a delay line analog-to-digital converter circuitry based upon the analog voltage received by the signal generator circuit, the delay line analog-to-digital converter circuitry operative to convert the analog voltage into a digital signal; and calibrating the signal generator circuit based on calibration feedback generated via conversion samples of the analog voltage into the digital signal by the delay line analog-to-digital converter circuitry.

In accordance with still further examples, the calibration circuitry can be configured to include gain calibration circuitry and offset calibration circuitry. The gain calibration circuitry may include a first set of charge pumps to produce a gain calibration signal supplied to the signal generator circuit. The offset calibration circuitry may include a second set of charge pumps to produce an offset calibration signal supplied to the signal generator circuit. The apparatus as discussed herein may further include: i) first pulse width calibration circuitry operative to adjust pulse widths of first pulse width modulation signals applied to the first set of charge pumps to calibrate the first set of charge pumps and a first phase frequency detector based on an output of the delay line analog-to-digital converter circuitry, and ii) second pulse width calibration circuitry operative to adjust pulse widths of second pulse width modulation signals applied to the second set of charge pumps to calibrate the second set of charge pumps and a second phase frequency detector based on the output of the delay line analog-to-digital converter circuitry.

Still further, the delay line analog-to-digital converter circuitry may include first D flip-flops and second D flip-flops. The first D flip-flops in the first delay line analog-to-digital converter circuitry and second D flip-flops in the second delay line analog-to-digital converter circuitry may be implemented with a negative setup time to provide overlap with respect to producing a digital output signal of the delay line analog-to-digital converter circuitry around the threshold level.

These and other more specific examples are disclosed in more detail below.

As discussed herein, techniques herein are well suited for use in the field of analog-to-digital conversion such as those implementing a respective delay line analog-to-digital converter. However, it should be noted that examples herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of examples herein (BRIEF DESCRIPTION OF EXAMPLES) purposefully does not specify every example and/or incrementally novel aspect of the present disclosure or claimed invention(s). Instead, this brief description only presents general examples and corresponding points of novelty over conventional techniques. For additional details and/or possible perspectives (permutations) of the invention(s), the reader is directed to the Detailed Description section (which is a summary of examples) and corresponding figures of the present disclosure as further discussed below.

BRIEF DESCRIPTION OF THE DRAWINGS

FIGS. 21A, 21B, and 21C are example diagrams illustrating a delay line ADC including circuitry as discussed herein.

FIG. 22 is an example diagram illustrating a method according to examples herein.

Figure 1:
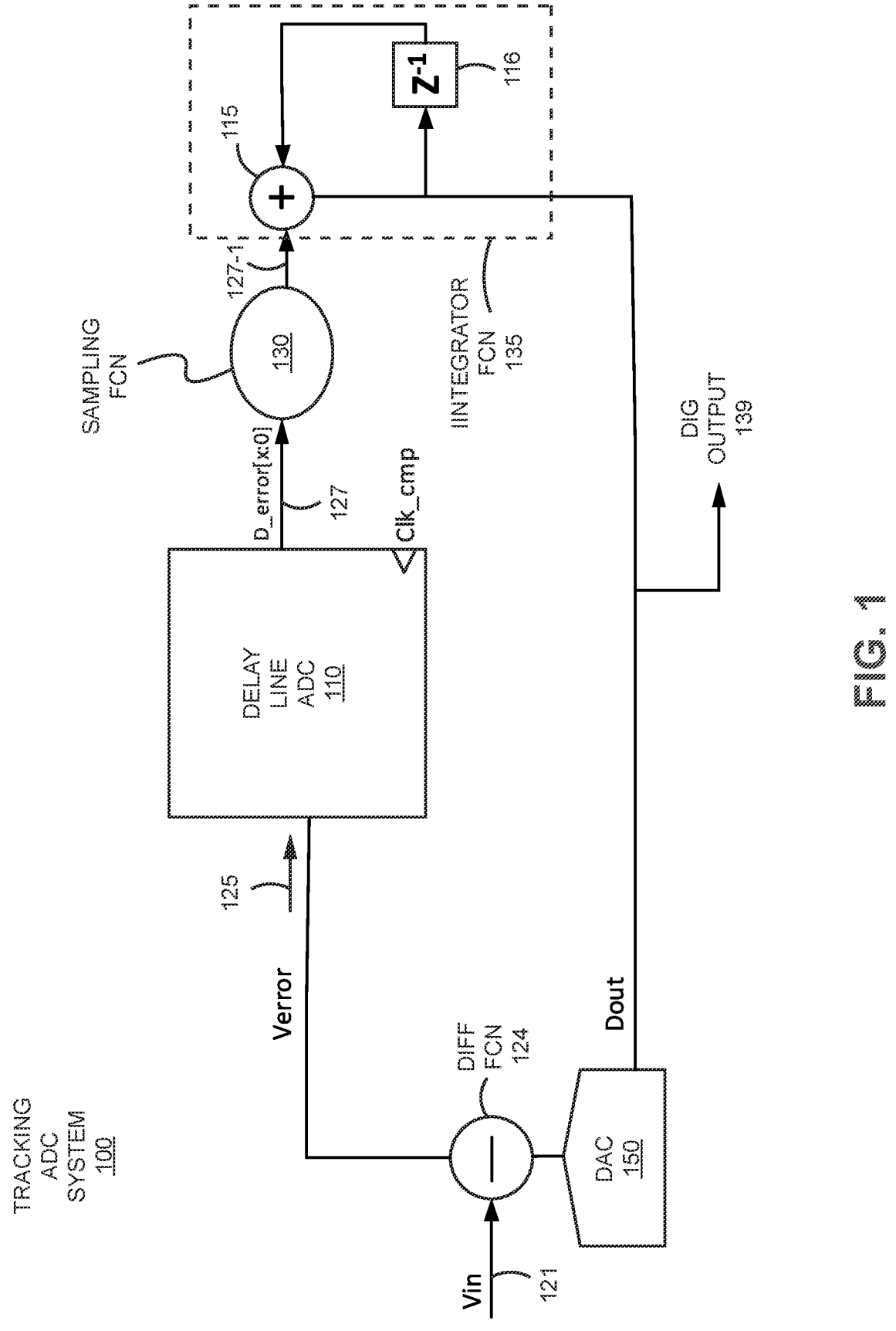
FIG. 1 is an example diagram of a tracking ADC system as discussed herein.

The foregoing and other objects, features, and advantages of the invention will be apparent from the following more particular description of preferred examples herein, as illustrated in the accompanying drawings in which like reference characters refer to the same parts throughout the different views. The drawings are not necessarily to scale, with emphasis instead being placed upon illustrating the examples, principles, concepts, etc.

DETAILED DESCRIPTION

Now, more specifically, FIG. 1 is an example general diagram illustrating a tracking ADC implementing a delay line ADC as discussed herein.

In general, in this example, the tracking ADC system 100 as shown in FIG. 1 converts the input voltage signal 121 (such as an analog input voltage signal) into a respective digital output signal 139. The digital output signal 139 tracks a magnitude of the input voltage signal 121.

More specifically, to convert the input voltage signal 121 into the output signal 139, via the difference function 124, the analog input voltage 121 is subtracted from a DAC output signal 126 (which is an analog representation of the digital output 139) generated by the digital to analog converter 150. The output signal 126 is a stored version of previous cycle ADC output (139). The difference function 124 produces the analog error voltage signal 125 as analog input signal 121, such as 'Vin', minus the DAC output signal 126. The delay line ADC 110 converts the analog error voltage signal 125 (a.k.a., vsig) into the digital error signal 127. The delay line ADC 110 outputs the digital error signal 127 to the sampling function 130.

The sampling function 130 outputs the samples of the digital error signal 127 as digital error signal 127-1 to the integrator function 135. The integrator function 135 includes summer 115 and storage resource 116 (storing a last sample of the digital output 139). When a new sample 127-1 (such as error correction value, which may be a positive or negative value as discussed herein) is received, the integrator function 135 sums the last sample of the digital output 139 to the current sample 127-1 and outputs it from the sampling function 130 to produce a new digital output 139.

In this way, the delay line ADC 110 outputs the digital error signal 127 (positive or negative error value), which is added via the integrator function 135 to the previous cycle output 139 of the ADC to create the new output 139 of the ADC.

As further shown, the constantly updated digital output 139 is fed to the digital to analog converter 150 for conversion into the output signal 126 again.

In this example, if the tracking ADC system 100 were to implement a comparator-based analog-to-digital converter function (instead of the delay line ADC 110), the corresponding ADC would be thus limited to incrementing/decrementing its output 127 by the range and resolution of those loop comparators. For a single comparator, the step size would be limited to +/−1 code while with multiple loop comparators, the step size will be set by the number of comparators and the resolution of the spacing between comparators thresholds.

However, the tracking analog-to-digital converter system 100 as discussed herein advantageously implements the delay line analog-to-digital converter 110 to provide an improved and more accurate circuitry over conventional techniques.

Thus, in one example, a delay line analog-to-digital converter 110 operable to convert an analog error voltage (125 or signal) into a digital error voltage signal (127); an integrator function 135 is operable to produce a digital value (139) representative of an analog input voltage (121), the digital value (139) adjusted based on samples of the digital error voltage signal (127) generated by the delay line analog-to-digital converter (110); and a digital-to-analog converter (150) operative to convert the digital value (139) received from the integrator function (135) into a second analog voltage 126, the analog error voltage 125 being a difference between the input voltage 121 and the second analog voltage (122).

Figure 2:
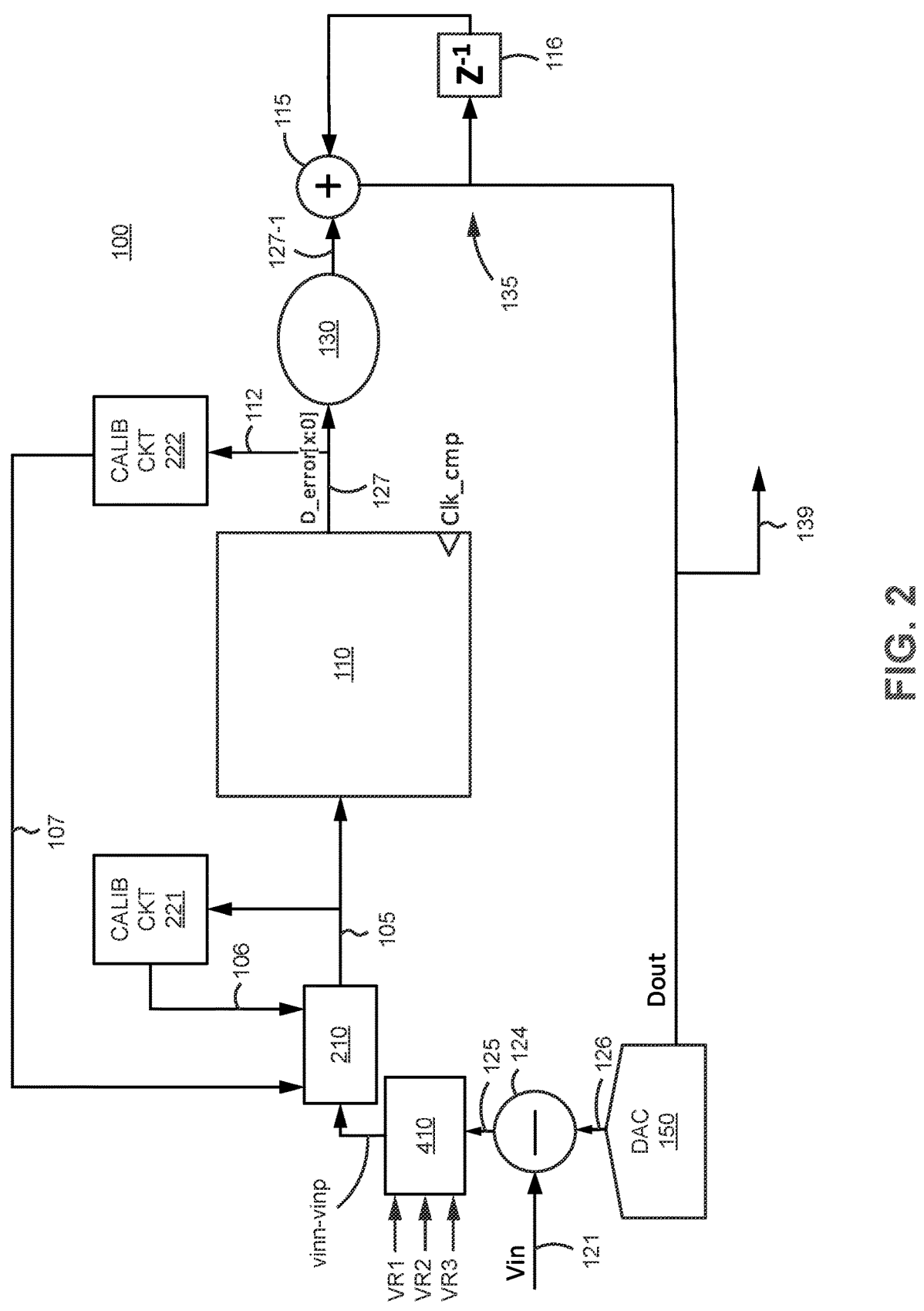
FIG. 2 is an example diagram illustrating a more detailed tracking ADC system including calibration circuitry as discussed herein.

FIG. 2 is an example diagram illustrating a tracking ADC circuit implementing calibration functionality as discussed herein.

In this example, the tracking ADC system 100 includes a voltage to time converter 210, calibration circuitry 221, and calibration circuitry 222. The tracking analog-to-digital converter system 100 operates in a similar manner as previously discussed. However, additionally, the calibration circuit 221 provides first calibration control feedback 106 (such as an offset adjustment signal) to the voltage to time converter 210. The calibration circuit 222 provides calibration control feedback 107 (such as a gain adjustment signal) to the voltage to time converter 210.

As its name suggests, the voltage time converter 210 is operable to receive the analog error voltage signal 125 from the difference function 124. As previously discussed, the delay line ADC 110 is operative to convert the analog error voltage signal 125 into a respective digital error signal 127. The voltage to time converter 210 in this example produces one or more respective control signals 105 to control operation of the delay line analog-to-digital converter 110 and timing of converting the analog error voltage signal 125 into the digital error signal 127.

Figure 4A:
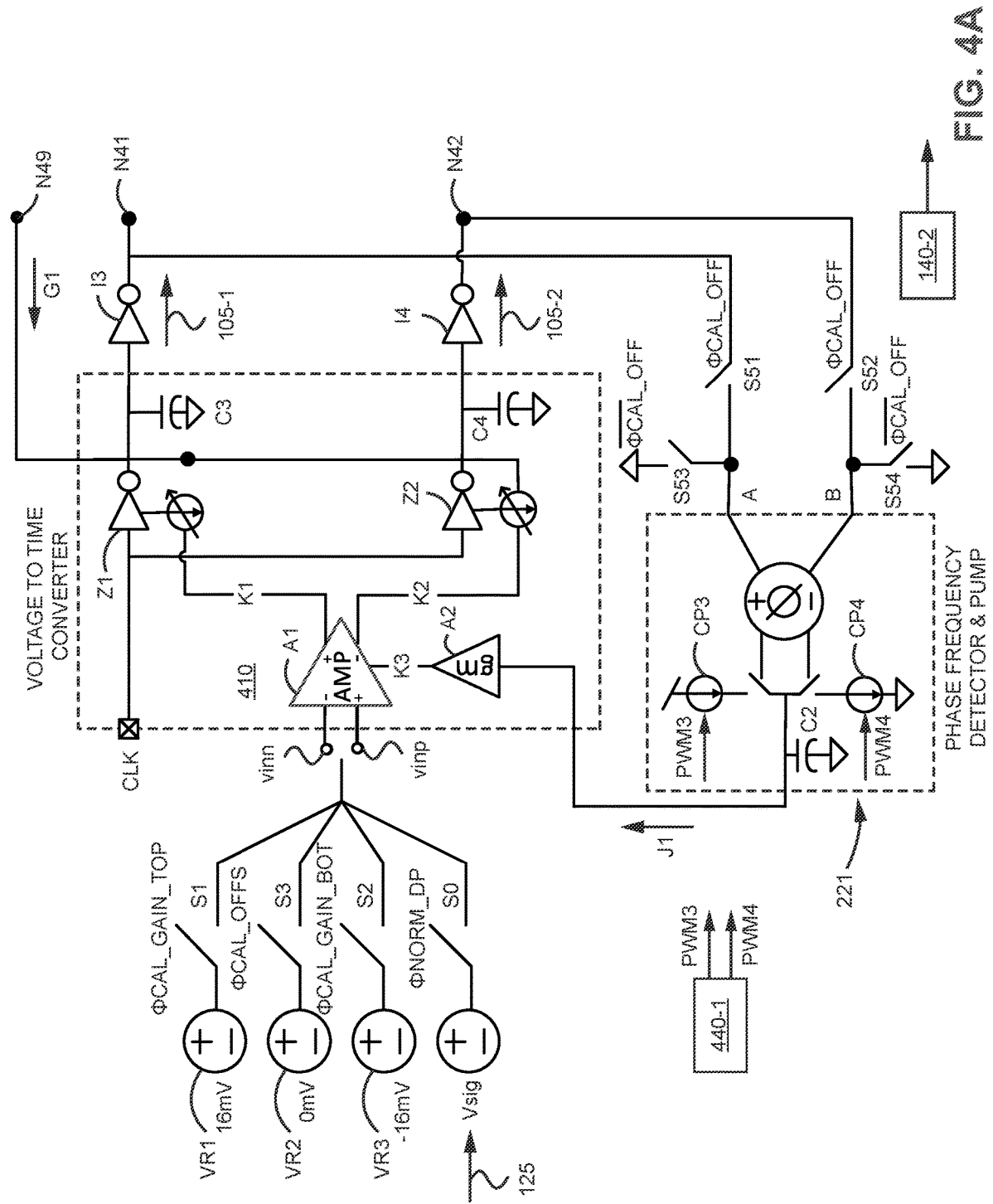
FIGS. 4A and 4B are example diagrams illustrating a voltage to time converter (signal generator), delay line ADC circuitry, and corresponding calibration circuitry as discussed herein.
Figure 4B:
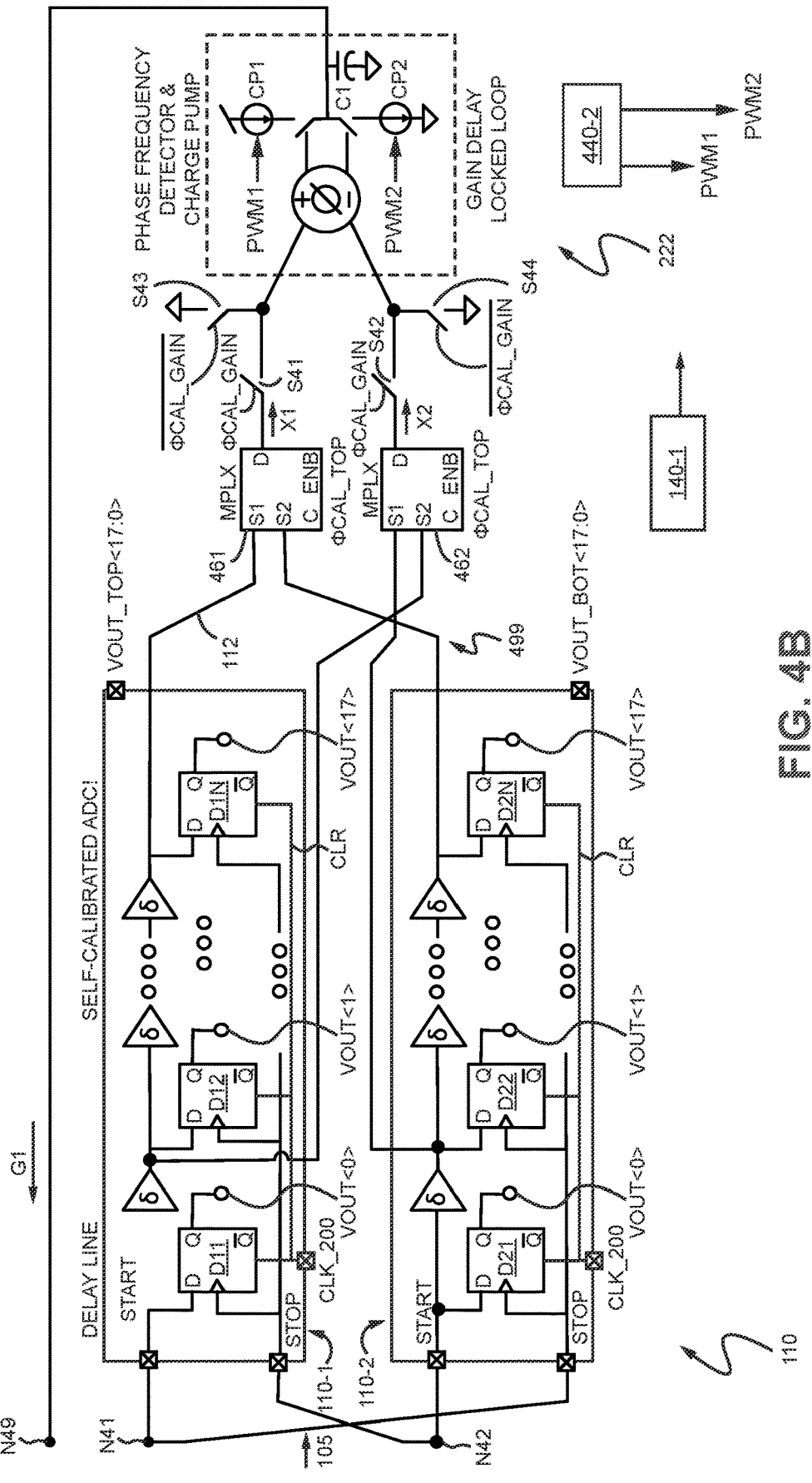

Yet further, the tracking ADC system 100 can be further configured to include the calibration circuit 221 to provide offset calibration associated with the voltage to time converter 210 based on feedback 106. The tracking ADC system 100 further includes the calibration circuit 222 to provide gain calibration associated with the voltage to time converter 210 based on feedback 107. Additional details of the calibration circuitry are shown in FIGS. 4A and 4B.

Referring again to FIG. 2, as further discussed herein, note that calibration of the voltage to time converter 210 and delay line analog-to-digital converter 110 (via the feedback 106 in the feedback 107) supports more accurate conversion of the analog error signal 125 into the digital error signal 127.

Accordingly, an apparatus or system as discussed herein includes delay line analog-to-digital converter circuitry 110, a signal generator circuit such as voltage to time converter 210, and calibration circuitry 221/222. The signal generator circuit (such as a voltage to time converter or other suitable entity) may be coupled to the delay line analog-to-digital converter circuitry 110. The signal generator circuit 210 can be configured to produce control signals 105 (such as start and stop signals, etc.) to control operation of the delay line analog-to-digital converter circuitry 110 based upon an analog voltage 125 or calibration signals received by the signal generator circuit for conversion into a digital signal 127. Further, the calibration circuitry 221/222 can be configured to calibrate the signal generator circuit based on calibration feedback (such as calibration feedback 106 and calibration feedback 107 such as adjustment signals) to ensure accurate operation of converting instances of the received analog voltage 125 into respective samples of the digital signal 127.

Yet further examples as discussed herein include implementation of the delay line analog-to-digital converter circuitry 110 in a tracking analog-to-digital converter circuit 100. The delay line analog-to-digital converter circuitry 110 can be configured to convert the analog voltage (125) received by the voltage to time converter 210 into a first digital signal (127) indicating a magnitude of the analog voltage (125). Note further that the analog voltage (125) may be a first analog voltage. The first analog voltage received by the signal generator (voltage to time converter 210) may be an analog error voltage representing a difference between an analog input voltage 121 and a second analog voltage 126 generated by the digital to analog converter 150. The second analog voltage 126 may be derived by a digital to analog converter 150 from a second digital signal (139), wherein the second digital signal (139) is derived from the first digital signal (127). In such an instance, the second digital signal (139) indicates a magnitude of the analog input voltage 121.

As further discussed herein, the selector 410 can be configured to apply any one of the signals analog voltage 125, reference voltage VR1, reference voltage VR2, reference voltage VR3, etc. Additional details of using these signals as discussed below.

Figure 3:
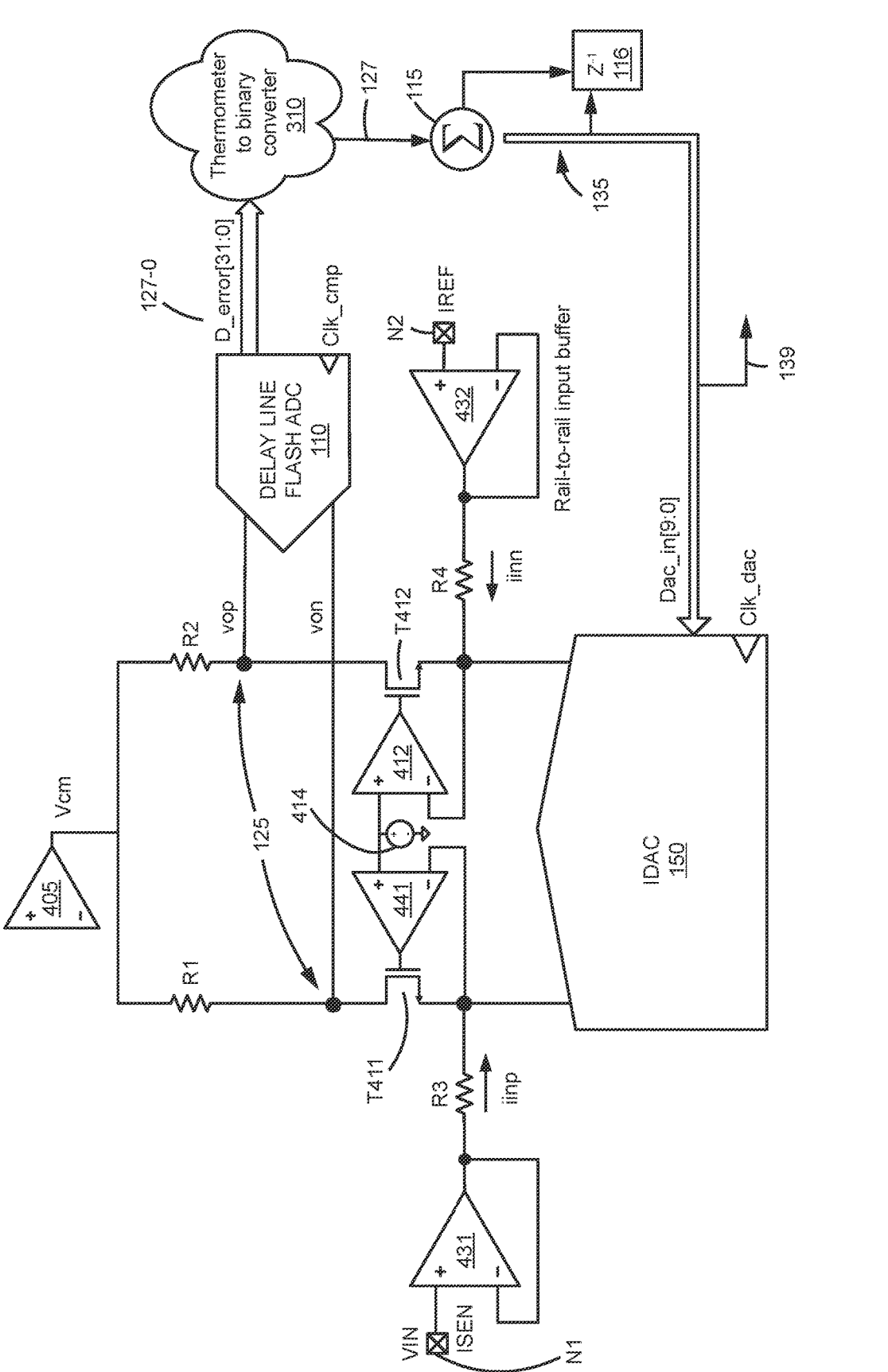
FIG. 3 is an example diagram illustrating a tracking ADC circuit as discussed herein.

FIG. 3 is an example general diagram illustrating a tracking ADC implementing a delay line ADC operative to support current sensing as discussed herein.

In this example, the tracking ADC 100 includes a respective novel implementation of a delay line ADC circuit 110 in comparison to conventional techniques.

For example, the error sense tracking and compensation loop associated with the tracking ADC system 100 includes voltage source 405, resistor R1, resistor R2, amplifier 411, amplifier 412, voltage source 414, transistor T411, transistor T412, resistor R3, resistor R4, delay line digital to analog converter 110, digital to analog converter 150, buffer 431, buffer 432, converter function 310 (such as a thermometer to binary converter function), integrator function 135, and so on.

In general, the digital-to-analog converter 150 in this example controls sinking of current (a.k.a., output current) with respect to the error sense circuitry 440. As shown, the error sense circuitry 440 receives the input signal 121 such as difference between signal ISEN (a.k.a., Vin) at node N1 and signal IREF (a.k.a., ground reference) at node N2. The voltage across node N1 and node N2 represents a differential voltage converted by the analog-to-digital converter as discussed herein. For example, the digital output signal 139 is a digital value indicating a magnitude of the corresponding input voltage or signal received across node N1 and node N2.

As further shown, the delay line ADC 110 receives the error signal 125 as a differential signal such as difference between the signal Von and the signal Vop, which represents a sample of the difference voltage (error voltage 125).

Further in this example, the delay line ADC 110 produces the respective error signal 127-0 such as a digital signal. In one example, the error signal 127-0 is encoded in accordance with a thermometer code. The system as discussed herein further includes the converter 310 operative to convert the error signal 127-0 via the thermometer code into a respective error signal 127 such as encoded in accordance with a standard binary code. The error signal 127 is supplied to the integrator function 135 as previously discussed.

Ideally, if the digital-to-analog converter 150 is set to the proper setting via the digital output signal 139, then the error signal 127-0 and error signal 127 is zero. In such an instance, the current from voltage source 405 through R1 equals the current from voltage source 405 through R2. However, when there is an imbalance of current through resistor R1 and resistor R2, the delay line ADC 110 produces a respective error signal 127-0 that is nonzero. The error signal 127-0 and error signal 127 may be a positive or negative value is generated by the delay line analog-to-digital converter circuitry 110. In response to the magnitude of the samples of the error signal 127, the integrator function 135 adjusts the digital output signal 139 up or down such that the error signal 127 over multiple sample cycles is biased toward zero. This supports an accurate conversion of the analog input voltage signal 121 (such as voltage across node N1 and node N2) into the digital output signal 139.

Thus, in one example:

The input buffers drive the current into the tracking loop.

The input voltage 121 is converted into an input current and subtracted from the DAC code.

The difference between the input current and DAC current goes through regulated cascodes to be amplified into an error voltage (vop–von) which is digitized into the error signal 127.

In one example, advantages of the novel tracking ADC 100 with delay line ADC 110 as discussed herein are as follows:

A 5-bit delay line ADC 110 may replace an otherwise implemented bank of 9 comparators with an equivalent of 32 comparators while still saving area and power and increasing the bandwidth of the tracking loop.

The delay line ADC 110 may achieve a larger range and smaller resolution of the error voltage for better transient tracking.

The delay line ADC 110 may digitize+/–16 mV range with 1 mV resolution

The delay line ADC 110 may be designed with low input impedance to maximize the tracking loop bandwidth.

The delay line ADC 110 conversation time=2.5 ns which is the smallest possible clock segment such that ISADC could operate at the fastest speed (7.5 ns settling time)

Area comparison:

DLFLASH which is equivalent to 32 comparators: 13336 sq. um.

9 comparator bank: 19888 sq. um.

Equivalent power for same speed

The delay line converts in 2.5 ns and uses 1.3 mA.

An equivalent 32 comparators would use 6.5 mA of current.

FIGS. 4A and 4B are example general diagrams illustrating a block diagram associated with the delay line ADC and corresponding calibration functionality as discussed herein.

In this example, with reference to FIGS. 4A and 4B and other drawings, the tracking ADC includes a selector function 410, the delay line analog-to-digital converter 110 (such as including delay line analog-to-digital converter 110-1 and delay line analog-to-digital converter 110-2), a voltage to time converter 210 (controller of the delay line ADC 110), calibration circuitry 221, and calibration circuitry 222.

The controller 140-2 or other suitable entity generates one or more control signals such as including signal dl_sig_sel (see also FIG. 9) to control switches S0, S1, S2, and S3.

Figure 9:
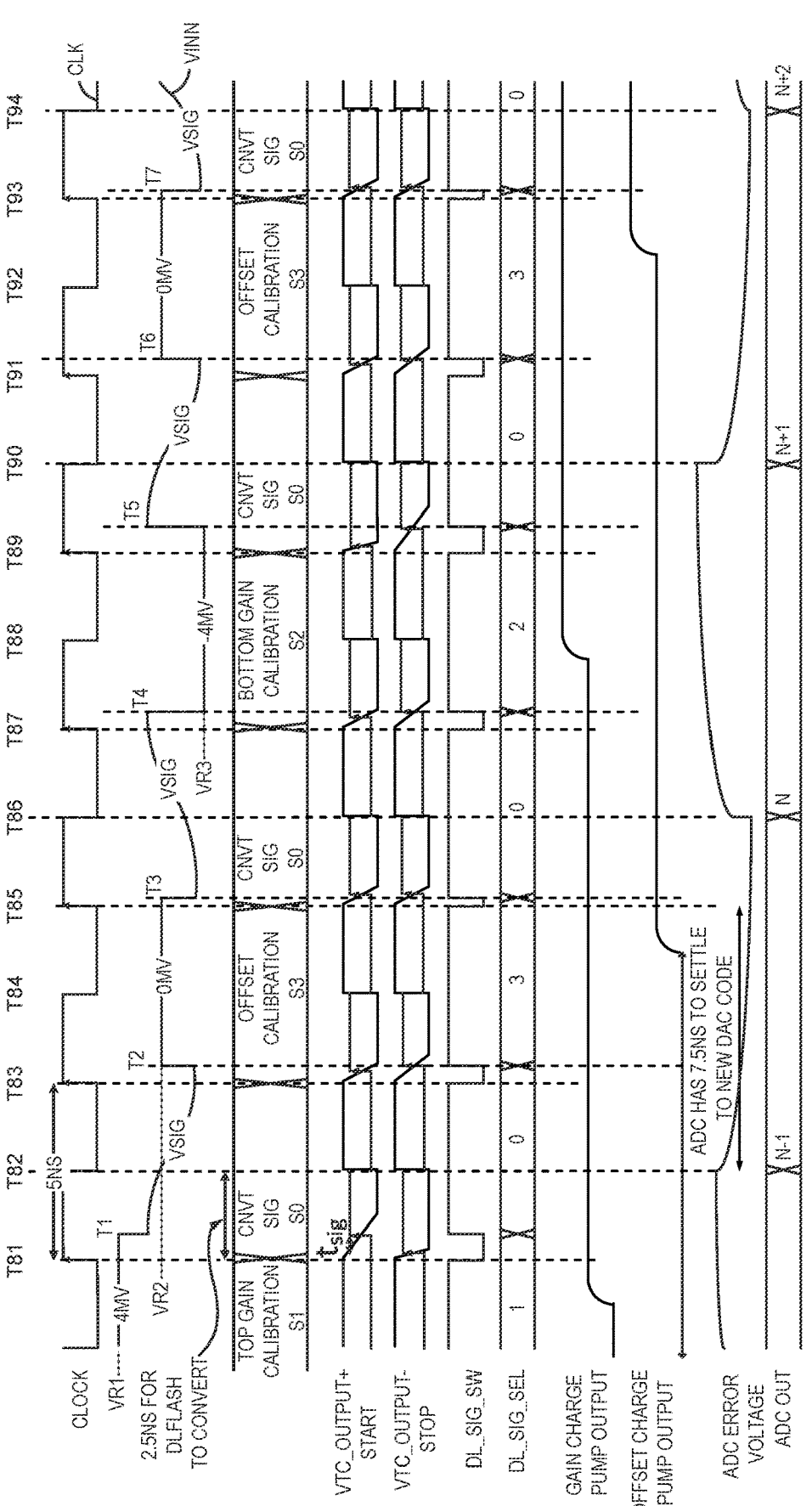
FIG. 9 is a timing diagram illustrating calibration of delay locked loops and analog-to-digital signal conversion as discussed herein.

As its name suggests, and as previously discussed, the selector function 410 controls which of multiple different voltages are inputted to the voltage to time converter 210. For example, in accordance with switching selection as shown in FIG. 9 and signal dl_sig_sel controlling the selection function 410, the selector function 410 switches between inputting the reference voltage the VR1 (such as 16 millivolts DC or other suitable value), the reference voltage VR2 (such as 0 millivolts or ground reference voltage during the suitable value), reference voltage VR3 (such as −16 millivolts DC or other suitable value), and the analog error voltage 125 (any signal of interest). In other words, the selector function 410 is controlled to vary which of the different reference voltages VR1 (Channel 1 associated with switch S1), VR2 (Channel 3 associated with switch S3), VR3 (Channel 2 associated with switch S2), or analog error voltage 125 (Channel 0 such as associated with switch S0) is inputted to the voltage to time converter 210 for conversion into a respective outputted digital error signal 127 (such as the multi-bit value generated by Q outputs of the first set of D flip-flops D11, D12, . . . , D1N or the second set of D flip-flops D21, D22, . . . , D2N).

As further shown, the voltage to time converter 210 includes amplifier A1. The amplifier A1 includes an inverting input to receive the differential voltages associated with the channels selected by the channel selector 410 at the input Vinn and a noninverting input to receive the input Vinp.

As previously discussed, the selector 410 controls which of the different reference voltages VR1, VR2, VR3, or analog error voltage 125 is inputted to the voltage to time converter 210.

Yet further, the positive output of the amplifier A1 produces signal K1 to drive the current starved inverter Z1. The negative output of the amplifier A1 produces signal K2 to drive the current starved inverter Z2. The current starved inverter Z1 receives the clock signal clk_200_n as input.

Additionally, the output K3 of the transconductance amplifier A2 provides offset calibration of the amplifier A1. As further shown, the voltage to time converter 210 further receives the clock signal CLK, which is inputted to each of the current starved inverter Z1 and the current starved inverter Z2. The current starved inverter Z2 receives the clock signal clk_200_n as input.

The current starved inverter Z1 produces the output signal voutp (voltage), which is stored in capacitor C3 and supplied to the inverter I3.

The current starved inverter Z2 produces the output signal voutn, which is stored in capacitor C4 and supplied to the inverter I4.

As further shown, the inverter I3 receives the signal voutp and inverts it to produce a corresponding control signal 105-1 applied to the node N41. The signal 105-1 at node N41 is a start signal for the delay line ADC 110-1. The signal 105-1 at node N41 is a stop signal for the delay line ADC 110-2.

The inverter I4 receives the signal voutn and inverts it to produce the output control signal applied to the node N42. The signal 105-2 at node N42 is a start signal for the delay line ADC 110-2. The signal 105-2 at node N42 is a stop signal for the delay line ADC 110-1.

With reference to FIG. 4B, each of the delay line ADCs 110-1 and 110-2 includes a sequence of multiple D flip-flops connected in series to produce the respective digital error signal 127-0. The digital output of each of the delay line circuitry 110 represents a corresponding magnitude of the differential voltage selected by the selector 410.

For example, the delay line ADC 110-1 (top delay line ADC) includes flip-flop D11, flip-flop D12, . . . , and flip-flop D1N. Each of the D flip-flops in the delay line ADC 110-1 is clocked by the stop signal 105-1 at node N42. The signal (such as clock pulse or signal edge) at node N41 passes through each of the delay elements (labeled delta) in accordance with respect of the ways associated with each delay element, which provides input to the respective D input of a respective D flip-flop. Overall, in one example, the delay line ADC 110-1 produces the top 18 bits (such as positive output values) such as top digital output bits 17:0 such as vout_top<17 . . . 0> for a given input voltage inputted to the voltage to time converter 210. Clock signal clk_200 (inversion of clock signal clk_200_n) resets each of the D flip-flops in the analog-to-digital converter circuitry 110-1.

The delay line ADC 110-2 (bottom delay line ADC) includes flip-flop D21, flip-flop D22, . . . , and flip-flop D2N. Each of the D flip-flops in the delay line ADC 110-2 is clocked by the stop signal at node N41. The signal at node N42 passes through each of the delay elements (labeled delta), which provides input to the respective D input of the respective flip-flop. Overall, the delay line ADC 110-2 produces the bottom 18 bits (for negative output values) such as bottom digital output bits 17:0 such as vout_bot<17 . . . 0> for a given input voltage inputted to the voltage to time converter 210. Clock signal clk_200 (inversion of clock signal clk_200_n) resets each of the D flip-flops in the analog-to-digital converter circuitry 110-2.

Thus, the input voltages (vinn and vinp) supplied to the voltage to time converter 210 in FIG. 4A is converted by the voltage to time converter 210 into a difference in time represented by the delay between start and stop rising edges at respective nodes N41 and N42. This delay is quantized by the delay line analog-to-digital converter circuitry to produce a respective digital output representative of the magnitude of the differential input voltage inputted to the amplifier A1 at nodes vinn and vinp. Thus, the delay line analog-to-digital converter circuitry 110 converts the differential voltage vinn and vinp into a respective sample digital output signal 139 produced by the respective delay line analog-to-digital circuitry 110.

In one example, note that the top and bottom delay lines are folded around the 0 mV error (reference voltage VR2). Start and stop signals (at node N41 and node N42) inputted to each of the delay line ADC 110-1 and the delay line 110-2 are swapped as previously discussed. Additionally, the bottom delay line ADC 110-2 digitizes the negative range associated with the delay line ADC 110 while the top delay line ADC 110-1 digitizes the positive range associated with the delay line ADC 110. Thus the delay line analog-to-digital converter circuitry 110-1 produces positive digital output values (127) when a magnitude of the differential voltage received by the amplifier A1 is positive; the delay line analog-to-digital converter circuitry 110-2 produces negative digital output values (127) when a magnitude of the differential voltage received by the amplifier A1 is negative.

As further shown, and as previously discussed, the circuitry shown in FIG. 4 can be configured to include multiple delay locked loops (such as calibration circuitry 221, and calibration circuitry 222) that control the resolution of the delay line ADC 110 over process, voltage temperature, and aging.

As further discussed herein, a delay lock loop (DLL) controls error from both the voltage to time converter 210 and each of the delay line ADCs associated with the delay line ADC 110.

Yet further, the additional FIGS. as discussed herein describe how the delay line ADC 110 and corresponding circuitry alternate conversion of the real input signal (such as the analog error voltage signal 125 or other signal) with calibrating the gain associated with the current starved inverters and the offset associated with the amplifier A1 such as while the rest of the tracking loop is settling.

In one example, the delay line analog-to-digital converter circuitry includes a first delay line analog-to-digital converter circuit 110-1 and a second delay line analog-to-digital converter 110-2 disposed in parallel to convert the received analog voltage (differential voltage as indicated by vinn and vinp) into corresponding samples of digital output signals.

As further discussed herein, the received analog voltage (vinn and vinp) can be supplied by a selector circuit 410 (such as a multiplexer circuit) where different types of analog voltage signals are inputted to the signal generator circuit (voltage to time converter 210) for conversion into respective samples of the digital signal 127-0.

In yet another example, as previously discussed, a first delay line analog-to-digital converter circuit 110-1 of the delay line analog-to-digital converter circuitry 110 is operative to generate a first portion of the corresponding samples for a first operational condition in which the analog voltage is greater than a threshold level such as for positive values; and a second delay line analog-to-digital converter circuit 110-2 of the delay line analog-to-digital converter circuitry 110 is operative to generate a second portion of the corresponding samples during a second operational condition in which the received analog voltage at the input of the amplifier A1 is less than the threshold level for negative values.

Note further that the control signals as discussed herein can be configured to include a first control signal such as voltage at node N41 and a second control signal such as voltage at node N42. The first control signal can be configured to control a start operation of the first delay line analog-to-digital converter circuit 110-1; the second control signal can be configured to control a stop operation of the first delay line analog-to-digital converter circuit 110-1. The second control signal can be configured to control a start operation of the second delay line analog-to-digital converter circuit 110-2; the first control signal can be configured to control a stop operation of the second delay line analog-to-digital converter circuit 110-2.

In accordance with still further examples as discussed herein, the apparatus can be configured to include selector circuitry 410 operative to select between a first output signal X1 generated by the first delay line analog-to-digital converter circuit 110-1 and a second output signal X2 generated by the second delay line analog-to-digital converter circuit 110-2. The calibration circuitry 222 can be configured to use the first signal X1 and the second signal X2 as a basis in which to calibrate the signal generator circuitry and/or the delay line analog-to-digital converter circuitry.

In accordance with still further examples, the calibration circuitry 222 can be configured to include a gain calibration loop where a gain associated with the delay line analog-to-digital converter circuitry 110 is configured to match a gain setting of a tracking loop associated with the tracking analog-to-digital converter circuit.

Still further, note that the signal generator circuit (voltage to time converter 210) can be configured to include an amplifier A1 operative to receive the analog voltage (differential voltage vinn and vinp). The calibration circuitry as discussed herein can be configured to include an offset calibration circuit 221 operative to monitor the control signals at node N41 and node N42 inputted to the delay line analog-to-digital converter circuitry 110. The offset calibration circuitry 221 further can be configured to generate an offset adjustment control signal J1 based on the monitored control signals at node N41 and node N42 inputted to the delay line analog-to-digital converter circuitry. The offset adjustment control signal J1 adjusts an offset associated with the amplifier A1. For example, the transconductance amplifier A2 receives the calibration signal J1 and converts it into an output signal supplied by the transconductance amplifier A2 to correct the offset associated with the amplifier A1.

In one example, the offset calibration circuitry 221 is an offset delay locked loop circuit operative to produce the offset adjustment control signal J1 and corresponding output signal of the transconductance amplifier A2 supplied to the amplifier A1.

In yet further examples, as previously discussed, the signal generator circuit (voltage to time converter 210) may include an amplifier A1 operative to receive the analog voltage (such as difference between vinn and vinp). The calibration circuitry as shown in FIG. 4B can be configured to include a gain calibration circuit 222 operative to monitor digital samples as outputted from the delay line analog-to-digital converter circuitry 110. The gain calibration circuitry 221 can be configured to generate a gain adjustment control signal G1 (at node N49) based on the outputted digital samples of the delay line analog-to-digital converter circuitry, where the generated gain adjustment control signal G1 (such as voltage stored in the capacitor C1) adjusts a gain associated with the amplifier subsequently converting further samples of the received analog voltage into the control signals. Note again that the gain calibration circuitry 221 can be configured as a gain delay locked loop circuit as shown in FIG. 4B.

In accordance with another example as discussed herein, the delay line analog-to-digital converter circuitry 110 can be configured to include: a first delay line analog-to-digital converter 110-1 operative to generate positive polarity error values associated with conversion of the received analog voltage (vinn and vinp) into the digital signal; and a second delay line analog-to-digital converter 110-2 operative to generate negative polarity error values associated with conversion of the received analog voltage into the digital signal.

In a further example, the signal generator circuit is a voltage-to-time converter 210 operative to produce a start signal (voltage at node N41) and a stop signal (voltage at node N42) supplied to the delay line analog-to-digital converter circuitry 110-1 where a magnitude of a time duration between the start signal and the stop signal depends on a magnitude of the received analog voltage at the input of amplifier A1. The calibration circuitry 221 can be configured to calibrate the voltage-to-time converter for a 10 based on the calibration feedback (such as voltage is monitor at the nodes N41 and N42) in a manner as previously discussed.

Yet further, the apparatus as discussed herein can be configured to include a selector circuit 410 operative to select amongst multiple analog inputs as the analog voltage inputted to the signal generator. For example, the selector circuit can be configured to select amongst: i) a first analog gain reference voltage VR1, ii) a second analog gain reference voltage VR3, iii) an offset reference voltage VR2, and iv) and the analog error voltage 125.

The analog voltage 121 received and converted into the digital signal 127 produced by the delay line analog-to-digital converter circuitry 110 as discussed herein can be: i) a first analog gain reference voltage, ii) a second analog gain reference voltage, iii) an offset reference voltage, or iv) the analog error voltage. In one example, the calibration circuitry (221 and/or 222) is operative to produce calibration feedback (such as gain adjustment control signal G1, offset adjustment signal J1, etc.) based on analog-to-digital conversions of the first analog gain reference voltage, the second analog gain reference voltage, and the offset reference voltage at different times during an analog-to-digital converter cycle.

Note that the calibration circuitry can be configured to include gain calibration circuitry 222 and offset calibration circuitry 221. As shown in FIGS. 4A and 4B, the gain calibration circuitry 222 may include a first set of charge pumps CP1 and CP2 to produce a gain calibration signal G1 supplied to the signal generator circuit 410. The gain calibration signal G1 calibrates a gain associated with the signal generator circuit 410. The offset calibration circuitry 221 may include a second set of charge pumps CP3 and CP4 to produce an offset calibration signal J1 supplied to the signal generator circuit 410. The offset calibration signal J1 calibrates the offset associated with the generator circuit 410. The apparatus as discussed herein may further include: i) first pulse width calibration circuitry 440-1 operative to adjust pulse widths of first pulse width modulation signals PWM1 and PWM2 applied to the respective first set of charge pumps CP1 and CP2 to calibrate the first set of charge pumps and corresponding first phase frequency detector (a.k.a., 221) based on an output of the delay line analog-to-digital converter circuitry in a calibration mode, and ii) second pulse width calibration circuitry 440-2 operative to adjust pulse widths of second pulse width modulation signals PWM3 and PWM4 applied to the second set of charge pumps CP3 and CP4 to calibrate the second set of charge pumps and a second phase frequency detector (a.k.a., 222) based on the output of the delay line analog-to-digital converter circuitry 110 in the calibration mode. First pulse width calibration circuitry operative to adjust pulse widths of first pulse width modulation signals applied to the first set of charge pumps and phase frequency detector to calibrate the first set of charge pumps and the phase frequency detector based on an output of the delay line analog-to-digital converter circuitry;

In one example, wherein the adjustment of the pulse widths of the first pulse width modulation signals reduces charge pump error and phase frequency detector error associated with the first set of charge pumps and phase frequency detector; the adjustment of the pulse widths of the second pulse width modulation signals reduces charge pump error and phase frequency detector error associated with the second set of charge pumps and phase frequency detector.

Figure 5A:
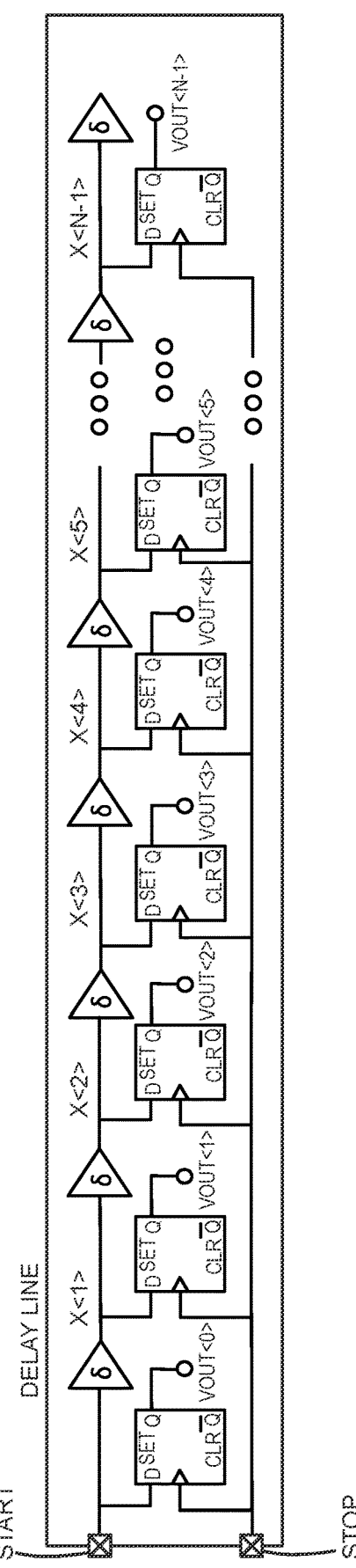
FIG. 5A is an example top level diagram illustrating a delay line ADC as discussed herein.

FIG. 5A is an example diagram of the delay line ADC as discussed herein. Delay Line Operation The schematic of the respective delay line analog-to-digital converter 110-1 and analog-to-digital converter 110-2 is shown in FIG. 5A. As previously discussed, the respective delay line analog-to-digital converter converts the time domain signals received from node N41 and node N42 into a corresponding digital code such as error signal 127.

Each delay line analog-to-digital converter includes a chain of delay cells which are represented by a buffer with a delay value of 8 seconds. The delay value delays propagation of a respective one or 0 inputted to the delay line analog-to-digital converter from the node N41 or node N42.

Each output of the buffers are connected to a flip-flop which is clocked by the stop signal.

The delay line operates by digitizing the difference between start and stop rising edge delay to convert the respective input voltage received at vinn and vinp into a respective digitized error signal 127 is stored in the D flip-flops of the delay line analog-to-digital converter circuitry 110.

Each flip flop in the chain of D flip-flops in each of the different delay line analog-to-digital converters hundred 10 acts as a comparator, which outputs a 1 if the delayed version of start is faster than the stop signal The delay line outputs the thermometer encoded signal of tsig/δ

Figure 5B:
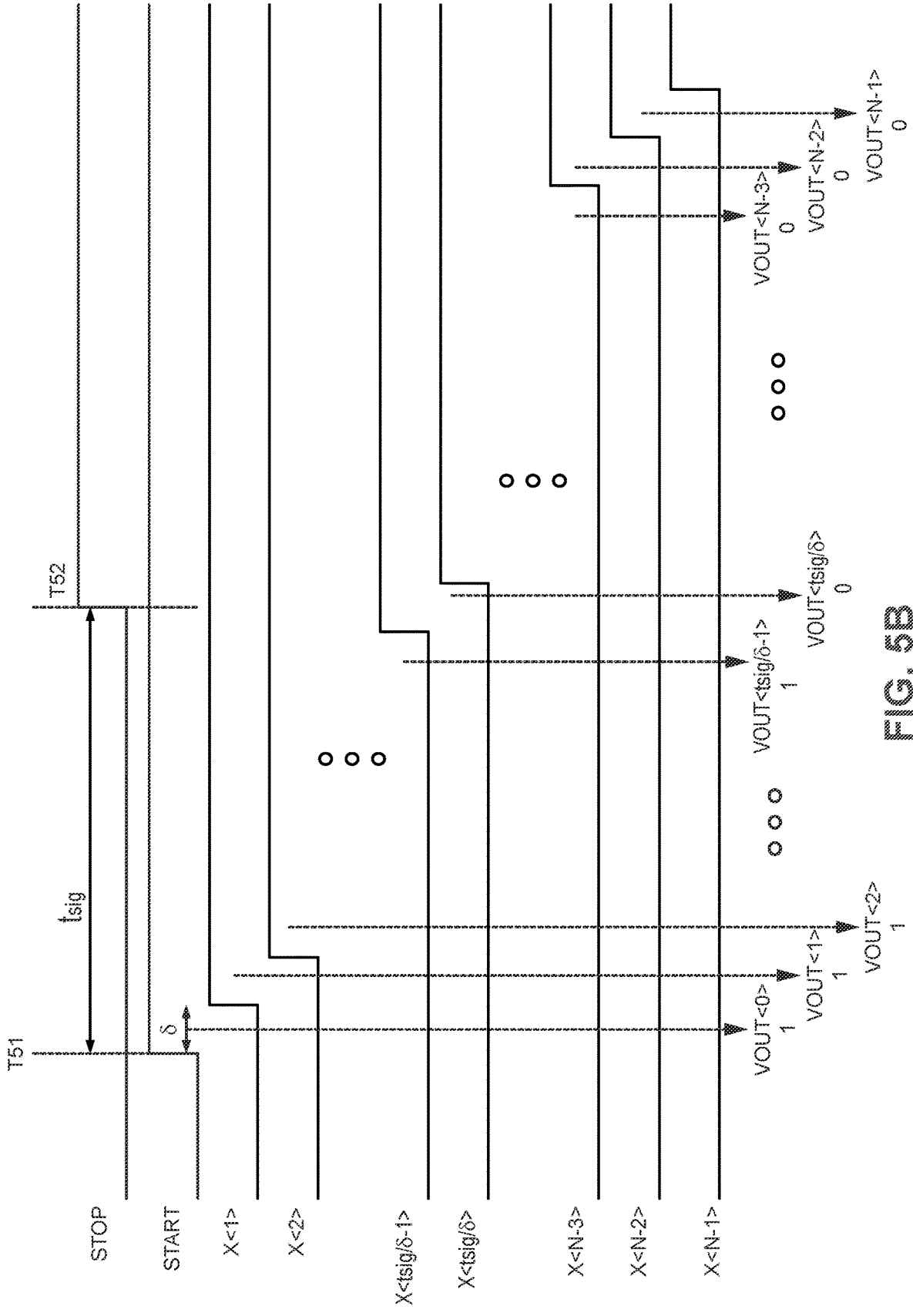
FIG. 5B is an example timing diagram illustrating signals associated with the delay line ADC as discussed.

FIG. 5B is a timing diagram associated with generating the respective control signals outputted from the voltage to time converter to control operation of the delay line ADC as discussed herein.

As shown in this example, the voltage to time converter 210 produces the rising edge of the START control signal from node N41 to occur at time T51. The voltage to time converter 210 produces the rising edge of the stop signal from node N42 to occur at time T52. The time difference between time T51 and T52 is tsig.

The logic 1 associated with the start signal from node N41 is conveyed through the series of delay elements as shown in FIG. 5A. The delay time associated with each of the delay elements is the value δ. At time T51, the delay line analog-to-digital converter 110 produces a respective error signal 127 based upon the settings of bits vout<0>=1, vout<1>=1, vout<2>=1, . . . , vout<tsig/δ−1>=0, vout<tsig/δ>=0, . . . , vout<n−3>=1, vout<n−2>=0, vout<n−1>=0 from the D flip-flops (such as Q outputs of the D flip-flops D11, D12, . . . , D1N or Q outputs of the D flip-flops D21, D22, . . . , D2N) of the delay line analog-to-digital converter circuitry 110-1 or 110-2 depending upon signal polarity of the received error signal 125.

Accordingly, the delay line analog-to-digital converter is shown in FIG. 5A and corresponding voltage to time converter 210 converts the received analog input voltage into a respective digital error signal 127 (digital output signal) based on the settings of the above bits (such as Q outputs of the D flip-flops D11, D12, . . . , D1N or Q outputs of the D flip-flops D21, D22, . . . , D2N) for a respective analog voltage conversion into a digital value.

Of course, as the magnitude of tsig varies depending upon a magnitude of the input voltage supplied at node vinn and vinp such as one of reference voltages VR1, VR2, VR3, or analog error voltage 125 as selected by the selective 410, the delay line analog-to-digital converter 110 produces corresponding digital error signals 127 proportional to the input voltage vinn and vinp.

Figure 6:
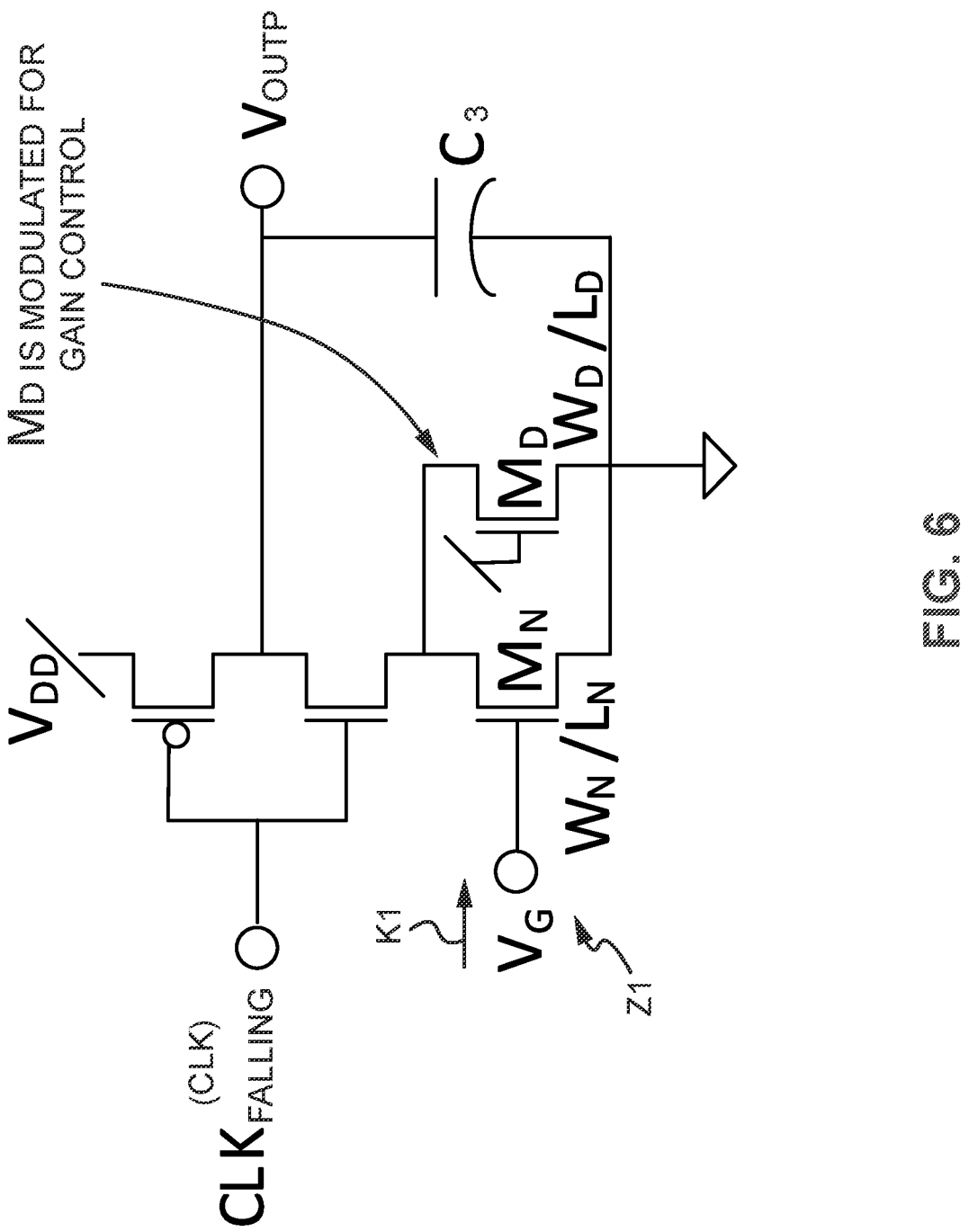
FIG. 6 is an example diagram illustrating a current starved inverter as discussed herein.

FIG. 6 is an example diagram illustrating a so-called current starved inverter as discussed herein.

As previously discussed, the voltage to time converter 210 can be configured to include one or more current starved inverters Z1 and Z2. FIG. 6 is an example of the current starved inverter Z1 that receives the clock CLK as an input signal to produce the respective output signal voutp. The current starved inverter Z2 is the same as current starved inverter Z1 that receives the clock CLK (clk_200_*n*) as an input signal to produce the respective output signal voutn.

The control voltage VG (such as signal K1) associated with the current starved inverter Z1 modulates the current through the inverter and so modulates the propagation delay (tpn) between the input falling clock edge of signal CLK (clk_200_*n*) and the output falling clock edge of signal CLK (note that the rising edge is unaffected).

Transistor MD provides a minimum amount of current to the inverter which leads to better linearity but less range.

The Delay Locked Loop (such as gain or offset) associated with the calibration circuitry 221/222 as discussed herein uses transistor MD to modulate the gain over process corners/temperature/life.

Differential CSI stages take the difference of two CSI (Current Starved Converter) stages such as Z1 and Z2 with differential voltage inputs around an input common mode voltage.

CSI input common mode has to be operated at the optimal point of the $\partial tp/\partial Vg$ to maximize the range.

Signal tsig becomes the difference of two falling edges (voutp and voutn) from duplicate CSI stages which leads to better linearity due to the same shape of the edge Differential CSI stages have twice the range for the same linearity performance and same operation region of the control voltage Formula for slew rate of current starved inverter output:

$$-(dV\_out)/dt = (i\_(d\_N) + i\_(d\_D))/C\_L$$

As previously discussed, the gain calibration circuitry 222 generates the corresponding adjustment signal G1 to control slew rates associated with the current starved inverters Z1 and Z2. The adjustments to the slew rates ensure that the conversion of the input voltages at the amplifier A1 are properly converted into a respective digital output voltage from the delay line analog-to-digital converter circuitry 110. For example, the slew rate adjustments is supported by the gain adjustment signal G1 ensure that the delay line analog-to-digital converter circuitry 110 produces the appropriate digital output value for each of the calibration voltages VR1, VR2, and VR3. Calibration of the circuitry with respect to these reference voltages ensures that the conversion of the analog signal 125 (VSIG) is as accurate as possible.

Figure 7:
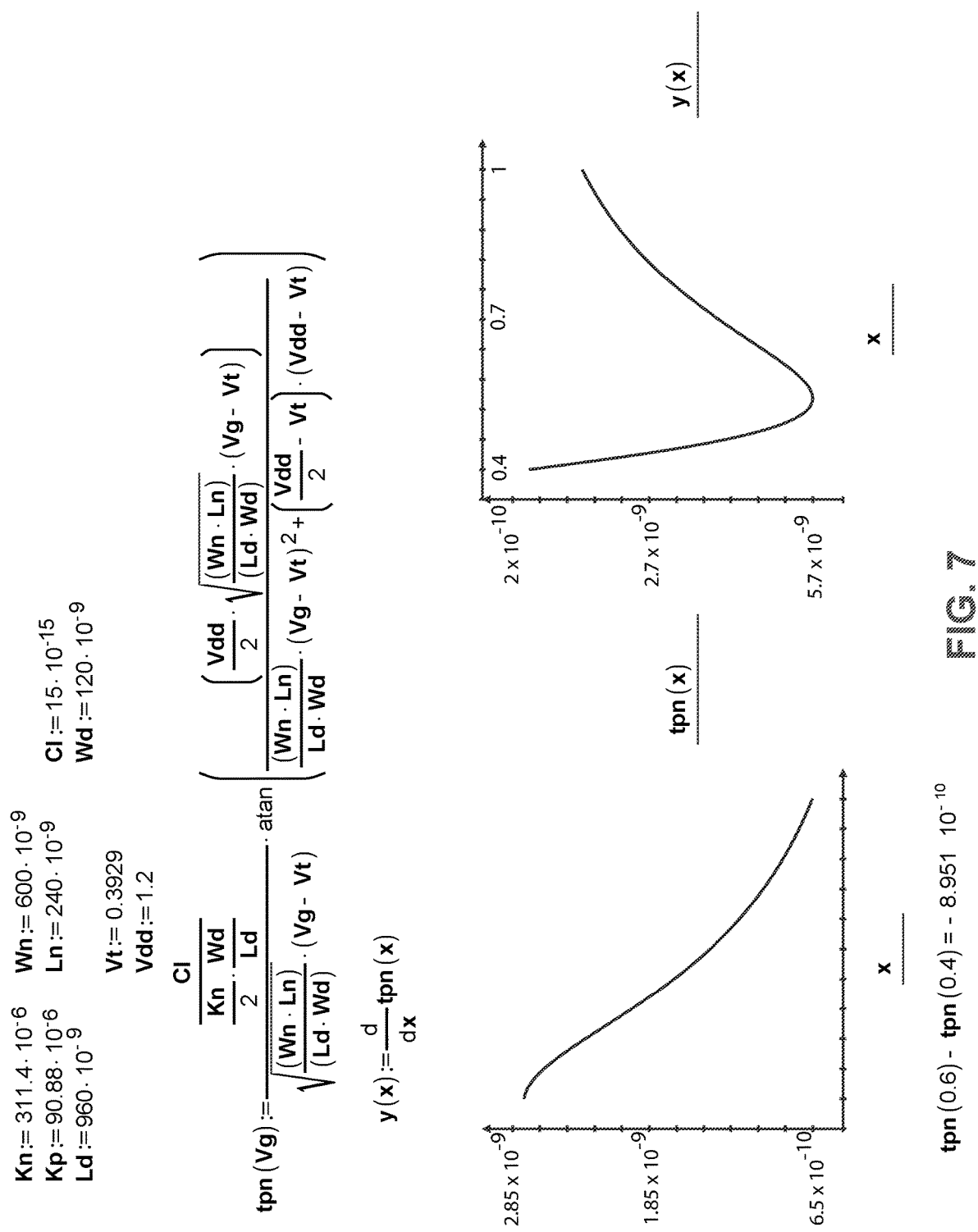
FIG. 7 is an example diagram illustrating equations associated with the current starved inverters implemented in an analog-to-digital converter as discussed herein.

FIG. 7 is an example diagram illustrating equations associated with the current starved inverters as discussed herein.

Figure 8:
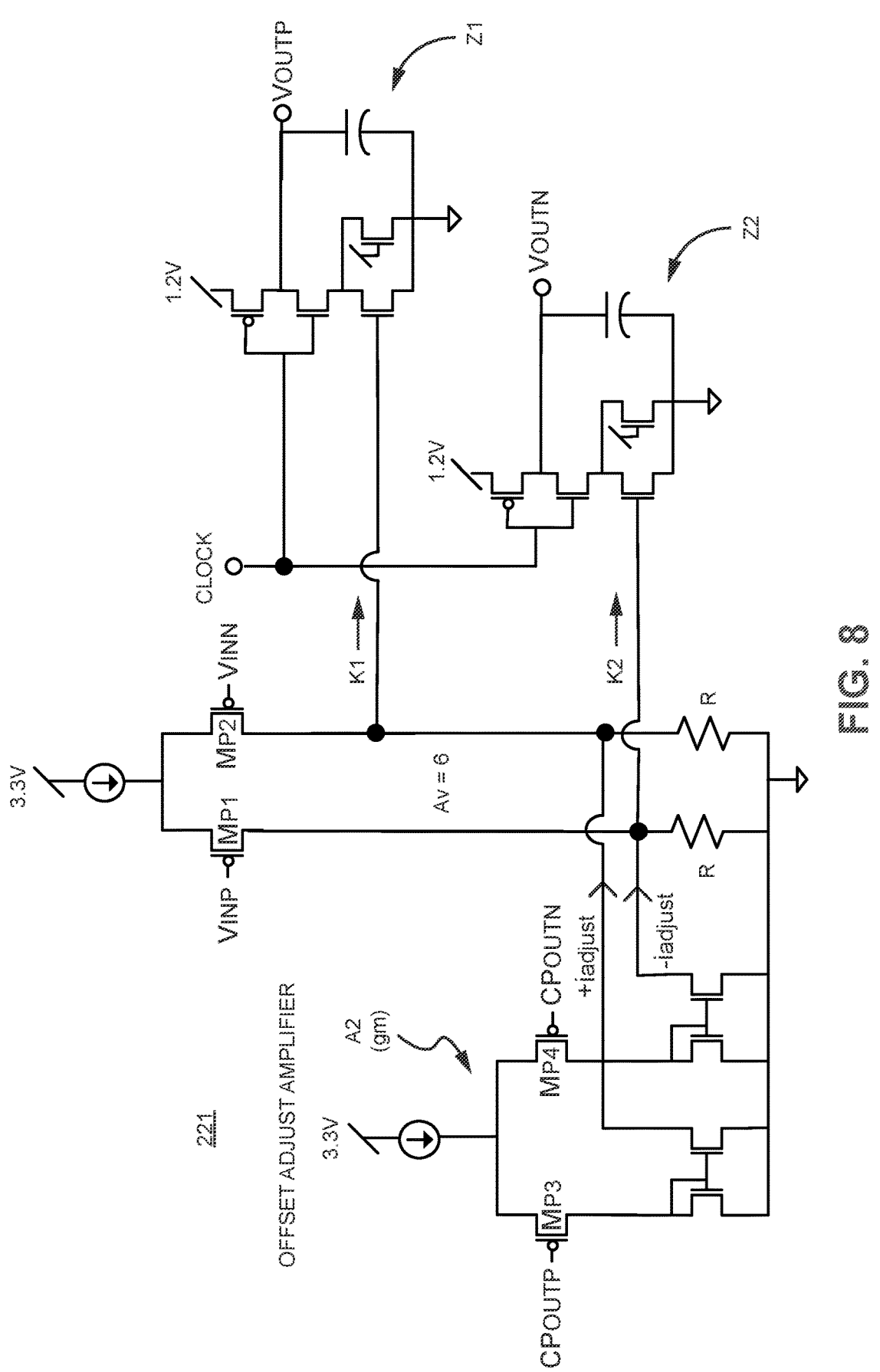
FIG. 8 is an example diagram illustrating a voltage to time converter as discussed herein.

FIG. 8 is an example diagram illustrating implementation of a voltage time converter as discussed herein.

The Voltage to time converter 210 can be configured to have a low input impedance front-end open loop amplifier to maximize the bandwidth of the tracking loop with a nominal gain of around 6 or other suitable value. The impedance can be minimized by selecting minimum sized devices for Mp1 and Mp2 since the offset their mismatch generates will be cancelled by the adjustment signal generated by the transconductance amplifier A2 associated with the offset Delay Locked Loop (calibration circuitry 221).

The current to the inverters Z1 and Z2 can be modulated with the differential output of the front-end.

Yet further, the VTC 210 also converts the voltage from the 3.3V domain to the 1.2V domain.

If desired, the Range/Resolution of the Flash delay line analog-to-digital converter can be increased by decreasing the gain of the open-loop front-end amplifier. Bandwidth requirement for front-end of CSI stage: must meet requirement from switching between signal & calibration maximum due to the DLL (Delay Lock Loop).

$$5\tau < 5 \text{ ns (for 100 } Mhz \text{ } VSADC) \rightarrow f_{3dB} > 1/(2*\pi*(1 \text{ ns})) > 159 \text{ } Mhz$$

MP3 and MP4 diff pair adjust the overall offset of the delay line flash by adjusting the offset to the input of the CSI.

Iadjust is used to correct the offset of the entire VTC+ delay line chain.

Largest contributors to the offset are the input pmos diff pair.

The overall offset is 250 ps which is the range that needs to be accommodated by the offset loop.

Dynamic Flip-Flop

Note further that so-called dynamic flip-flop can be implemented for the flip-flops in the delay line analog-to-digital converter circuitry 110.

The dynamic flip-flop can provide negative setup time where the clock can arrive slightly before data.

This is a desirable feature in order to capture the 0 mV error voltage crossing and avoid a dead band for the ADC.

Flip-flop is placed at the zero cross point to have more resolution around the 0 error voltage. When start and stop our perfectly aligned with each other, both the first flip-flops of top and bottom delay lines will output 1. All other flip-flops will output 0

In total, four flip-flops can provide information about error voltages close to 0 in steady-state and determine how to step the tracking ADC Encoding of DLADC (Delay Line Analog-to-Digital Converter 110)

The encoding of the delay line analog-to-digital converter 110 is shown in Table 1.

The top delay line (delay line analog-to-digital converter 110-1) and the bottom delay line (delay line analog-to-digital converter 110-2) have separate output busses. Flip-flops were added to the 0 input signal so there is no dead-band region near zero. There will be redundancy in the vout_top<0> and vout_bot<0> outputs since they both capture the middle crossing.

The flip-flop used has a slightly negative setup time (−2.8 ps) which varies over process and mismatch but is always negative.

The added bits should give us more flexibility in how the ADC can step.

The step size of the ISADC can be changed based on the four combinations of vout_top<0> and vout_bot<0>.

If they are both 1, it means that the signal is between 0 mV+/− setup time of flip-flop (between −150 uV and 150 uV)

TABLE 1

| vsig | vout top<17:0> | vout bot<17:0> | case #1 | case #2 | case #3 |
|---|---|---|---|---|---|
| −16 mv | 000000000000000000 | 001111111111111111 | 16 | 16 | 17 |
| −15 mv | 000000000000000000 | 000111111111111111 | 15 | 15 | 16 |
| −14 mv | 000000000000000000 | 000011111111111111 | 14 | 14 | 15 |
| −13 mv | 000000000000000000 | 000001111111111111 | 13 | 13 | 14 |
| −12 mv | 000000000000000000 | 000000111111111111 | 12 | 12 | 13 |
| −11 mv | 000000000000000000 | 000000011111111111 | 11 | 11 | 12 |
| −10 mv | 000000000000000000 | 000000001111111111 | 10 | 10 | 11 |
| −9 mv | 000000000000000000 | 000000000111111111 | 9 | 9 | 10 |
| −8 mv | 000000000000000000 | 000000000011111111 | 8 | 8 | 9 |
| −7 mv | 000000000000000000 | 000000000001111111 | 7 | 7 | 8 |

TABLE 1-continued

| vsig | vout top<17:0> | vout bot<17:0> | case #1 | case #2 | case #3 |
|---|---|---|---|---|---|
| −6 mv | 000000000000000000 | 000000000000111111 | 6 | 6 | 7 |
| −5 mv | 000000000000000000 | 000000000000011111 | 5 | 5 | 6 |
| −4 mv | 000000000000000000 | 000000000000001111 | 4 | 4 | 5 |
| −3 mv | 000000000000000000 | 000000000000000111 | 3 | 3 | 4 |
| −2 mv | 000000000000000000 | 000000000000000011 | 2 | 2 | 3 |
| −1 mv | 000000000000000000 | 000000000000000001 | 1 | 1 | 2 |
| −0.15 mv | 000000000000000000 | 000000000000000001 | 1 | 0 | 1 |
| 0 mv | 000000000000000001 | 000000000000000001 | 0 | 0 | 0 |
| 0.15 mv | 000000000000000001 | 000000000000000011 | −1 | 0 | −1 |
| 1 mv | 000000000000000011 | 000000000000000000 | −1 | −1 | −2 |
| 2 mv | 000000000000000111 | 000000000000000000 | −2 | −2 | −3 |
| 3 mv | 000000000000001111 | 000000000000000000 | −3 | −3 | −4 |
| 4 mv | 000000000000011111 | 000000000000000000 | −4 | −4 | −5 |
| 5 mv | 000000000000111111 | 000000000000000000 | −5 | −5 | −6 |
| 6 mv | 000000000001111111 | 000000000000000000 | −6 | −6 | −7 |
| 7 mv | 000000000011111111 | 000000000000000000 | −7 | −7 | −8 |
| 8 mv | 000000000111111111 | 000000000000000000 | −8 | −8 | −9 |
| 9 mv | 000000001111111111 | 000000000000000000 | −9 | −9 | −10 |
| 10 mv | 000000011111111111 | 000000000000000000 | −10 | −10 | −11 |
| 11 mv | 000000111111111111 | 000000000000000000 | −11 | −11 | −12 |
| 12 mv | 000001111111111111 | 000000000000000000 | −12 | −12 | −13 |
| 13 mv | 000011111111111111 | 000000000000000000 | −13 | −13 | −14 |
| 14 mv | 000111111111111111 | 000000000000000000 | −14 | −14 | −15 |
| 15 mv | 001111111111111111 | 000000000000000000 | −15 | −15 | −16 |
| 16 mv | 011111111111111111 | 000000000000000000 | −16 | −16 | −17 |

The delay line analog-to-digital converter circuitry 110 as discussed herein may include first D flip-flops and second D flip-flops as previously discussed. The first D flip-flops in the first delay line analog-to-digital converter circuitry 110-1 and second D flip-flops in the second delay line analog-to-digital converter circuitry 110-2 may be implemented with a negative setup time to provide overlap with respect to producing a digital output signal of the delay line analog-to-digital converter circuitry 110 around the threshold level of 0 volts.

FIG. 9 is an example diagram illustrating interleaving of calibration and converter operation of the delay line ADC as discussed herein.

Calibration Sequence Using the Delay Locked Loops

Figure 11:
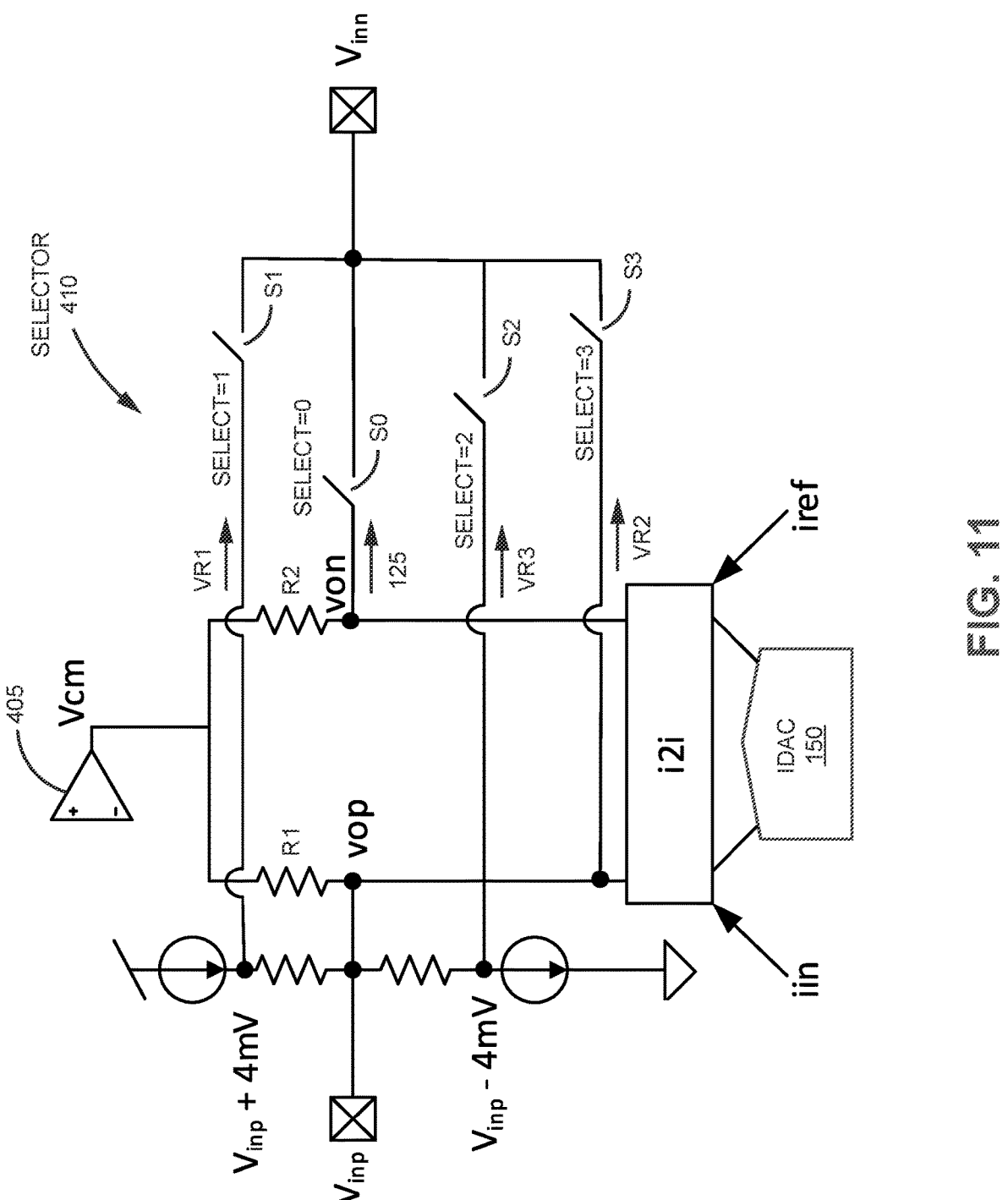
FIG. 11 is an example diagram illustrating implementation of a selector circuit for calibration in signal conversion within a corresponding tracking loop as discussed herein.

Ideally, the clock signal and the output of the last buffer in the delay line analog-to-digital converter should be perfectly aligned when the input is at the maximum. The Delay Locked Loop swaps between calibration phase and normal operation where the tracking loop output is digitized. FIG. 9 shows the timing diagram of the dlflash calibration scheme associated with the operation of the delay line analog-to-digital converter circuitry 110. Further details of the selector 410 are shown in FIG. 11. Referring again to FIG. 9 and FIG. 11, the input vinp to the amplifier A1 is the same as signal vop when the analog error voltage signal 125 is selected.

As previously discussed with respect to FIG. 4A in FIG. 4B, the offset calibration circuitry 221 includes switches S51, S52, S53, and S54 controlled by controller 140-1. The calibration circuitry 222 includes switches S41, S42, S43, and S44 controlled by controller 140-2.

Via the selector 410, the input vinn (such as the signal von when the analog error voltage signal 125 as selected) to the amplifier A1 of the voltage to time converter 210 and the corresponding delay line analog-to-digital converter swap or vary over time between:

top gain calibration (reference voltage VR1) where switch S1 (Channel 1) is activated to an on state and all other switches S0, S2, S3 of the selector 410 are off; for top gain calibration, switches S41, S42, S53, S54, are all set to a closed state (on); for top gain calibration, switches S43, S44, S51, S52, are all set to an open state (off);

signal conversion (analog error voltage signal 125 or vsig) where switch S0 (Channel 0) is activated to an on state (closed state) and all other switches S1, S2, S3 of the selector 410 are off (open) between time T1 and time T2; between time T1 and time T2, switches S43, S44, S53, S54, are all set to a closed state (on); between time T1 and time T2, switches S41, S42, S51, S52, are all set to an open state (off);

offset calibration (reference voltage VR2) where switch S3 (Channel 3) is activated to an on state and all other switches S0, S1, and S2 of the selector 410 are off between time T2 and time T3; between time T2 and time T3, switches S43, S44, S51, S52, are all set to a closed state (on); between time T2 and time T3, switches S41, S42, S53, S54, are all set to an open state (off);

signal conversion (analog error voltage signal 125 or vsig) where switch S0 (Channel 0) is activated to an on state (closed state) and all other switches S1, S2, S3 of the selector 410 are off (open) between time T3 and time T4; between time T3 and time T4, switches S43, S44, S53, S54, are all set to a closed state (on); between time T3 and time T4, switches S41, S42, S51, S52, are all set to an open state (off);

bottom gain calibration (reference voltage VR3) where switch S2 (Channel 2) is activated to an on state and all other switches S0, S1, S3 of the selector 410 are off between time T4 and time T5; between time T4 and time T5, switches S41, S42, S53, S54, are all set to a closed state (on); between time T4 and time T5, switches S43, S44, S51, S52, are all set to an open state (off);

signal conversion (analog error voltage signal 125 or vsig) where switch S0 (Channel 0) is activated to an on state (closed state) and all other switches S1, S2, S3 of the selector 410 are off (open) between time T5 and time T6; between time T5 and time T6, switches S43, S44, S53, S54, are all set to a closed state (on); between time T5 and time T6, switches S41, S42, S51, S52, are all set to an open state (off);

offset calibration (reference voltage VR2) where switch S3 (Channel 3) is activated to an on state and all other switches S0, S1, and S2 of the selector 410 are off between time T6 and time T7; between time T6 and time T7, switches S43, S44, S51, S52, are all set to a closed state (on); between time T6 and time T7, switches S41, S42, S53, S54, are all set to an open state (off);

Top gain and bottom gain states as discussed above and corresponding calibration circuitry 222 support calibration of the gain associated with the voltage to time converter 210 and corresponding delay line analog-to-digital converter 110. The offset states as discussed above and corresponding calibration circuitry 221 support calibration of the offset associated with the voltage to time converter 210 corresponding delay line analog-to-digital converter 110.

As shown in FIG. 9, and as previously discussed, the calibration circuit 221 produces the corresponding offset calibration signal J1 supplied to the transconductance amplifier A2 based on feedback of monitoring the nodes N41 and N42 during calibration phases. The transconductance amplifier A2 converts the received gain calibration signal J1 into the adjustment signal K3 applied to the amplifier A1. The signal K2 provides offset calibration to the amplifier A1 in corresponding circuitry in FIG. 4.

As further shown in FIG. 9, the calibration circuit 222 produces the corresponding gain calibration signal G1 (gain adjustment control signal) supplied to each of the current starved inverters Z1 and Z2. The gain calibration signal G1 (such as feedback) controls the output slew rate of the current starved inverters Z1 and Z2 generating the respective output signals voutp and voutn. This provides gain calibration to the voltage to time converter 210 and corresponding circuitry in FIG. 4.

In one example, during gain calibration using the calibration circuitry 222, the input to the voltage to time converter 210 is connected to the 4 mV or −4 mV (a.k.a., reference voltage VR1 or reference VR3 which can be any suitable voltage) and the phase error between stop of one delay line and the 4 buffer delayed version of the alternate delay line is reduced. The charge pump (CP1 and CP1) stores the average value of the gain of top and bottom delay lines in the capacitor C1.

During offset calibration, the inputs to the DLFLASH are shorted and the differential outputs of the VTC 410 are compared and a transconductance amplifier A2 differentially adjusts the output of the VTC front-end amp (output of the amplifier A1) to compensate the offset of the VTC (410) and the Delay lines (110).

The delay line analog-to-digital converter 110 can be configured to operate twice within one ADC clock cycle— 1st error digitization associated with the received signal 125 and 2nd the gain and offset calibration.

Calibration can be configured to occur in the time when the tracking loop settles to the new DAC code and thus does not slow down the overall ISADC conversion time. So in the 100 Mhz ADC clock rate, 2.5 ns is allocated to the DLFLASH while 7.5 ns is allocated to the ADC tracking loop to settle. For example, the input voltage VSIG settles to a new value between time T82 and T85 for conversion while offset calibration occurs between time T2 and T3. Input voltage VSIG settles to a new value for conversion between time T86 and T90 while offset calibration occurs between time T4 and T5.

The dl_sig_sw signal goes high when start and stop signal are generated. When dl_sig_sw goes high, the inputs to the DLFLASH are switched to the next value. As shown in FIG.

9, the selector circuit 410 can be configured to interleave conversion of the received analog voltage (such as input vinn and vinp of the amplifier A1) such as an analog error voltage 125 amongst conversions of the first analog gain reference voltage VR1, the second analog gain reference voltage VR2, and the offset reference voltage VR3. In other words, conversion of the first analog gain reference voltage, the second analog gain reference voltage, and the offset reference voltage supports calibration of the signal generator circuit in a manner as previously discussed. In such an example, the analog-to-digital converter circuit and/or the signal generator circuit as discussed herein can be constantly calibrated in between instances of converting the analog error voltage into respective samples of the digital signal. The constant or repetitive function of calibrating the analog-to-digital converter (including the signal generator and/or the delay line analog-to-digital converter circuitry) ensures that the respective samples of the digital signal outputted from the analog-to-digital converter circuitry 110 represent the analog error voltage as accurate as possible.

Figure 10:
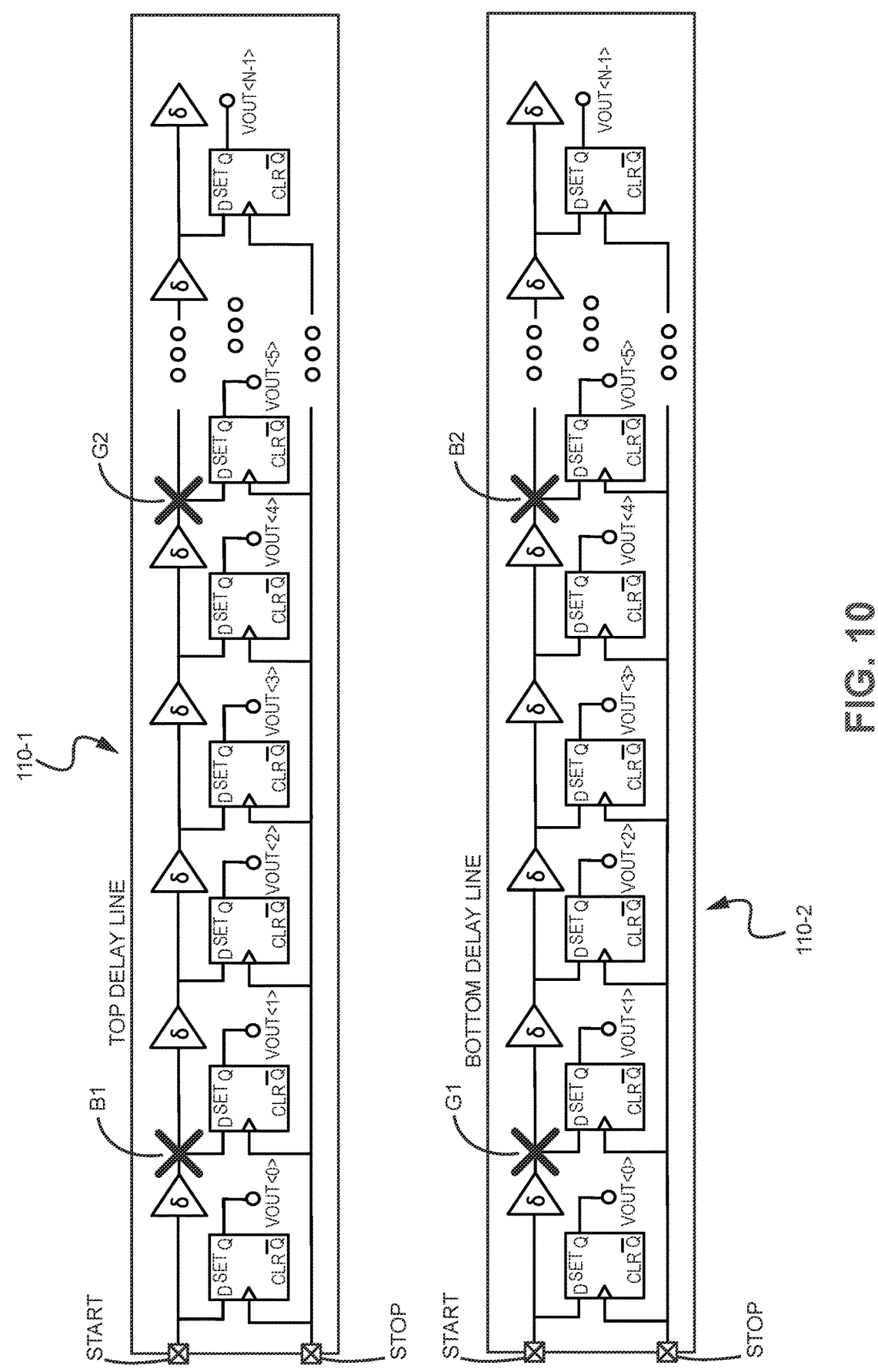
FIG. 10 is an example diagram illustrating tap associated with calibration gain as discussed herein.

FIG. 10 is an example diagram illustrating multiple tap points to calibrate the delay line ADC as discussed herein.

In this example, gain calibration is executed for $\delta sig=tstart-tstop=+/-(N-2)*\delta LSB$ For signal=+4*$\delta$LSB, node G1 in the G2 are tapped into the PFD [for top gain calibration].

For signal=−4*$\delta$LSB, node B1 and B2 are tapped into the PFD [for bottom gain calibration].

FIG. 11 is an example diagram illustrating implementation of a multiplexer (selector) and corresponding connections for calibration associated with the delay line ADC as discussed herein.

FIG. 11 shows the connections for the calibration of the DLFLASH circuitry as discussed herein. These connections are generated within the ADC tracking loop and provide the +4 mV (reference voltage VR1), −4 mV (reference voltage VR3) for the gain calibration. Because the current sources which generate the references are based on the same bandgap voltage divided by a resistor designed to match the reference, amplification and input resistors and generate the current for the IDAC; and since the references track with the input common mode for the DLFLASH, the references contain the gain error for the tracking loop and the DLFLASH is calibrated to this same gain error which means that no further trimming for the DLFLASH is required.

For offset calibration, the inputs to the DLFLASH are simply shorted. 'dl_sig_sel' from FIG. 9 is the same as 'select' in FIG. 11.

In this example, for each analog-to-digital conversion within one cycle, one of the switches as S0, S1, S2, and S3 is selected by the selector 410 to supply a respective voltage to the node vinn of the amplifier A1 of the voltage to time converter 210. See FIG. 9 for selection of the different states were a respective conversion cycle.

Figure 12:
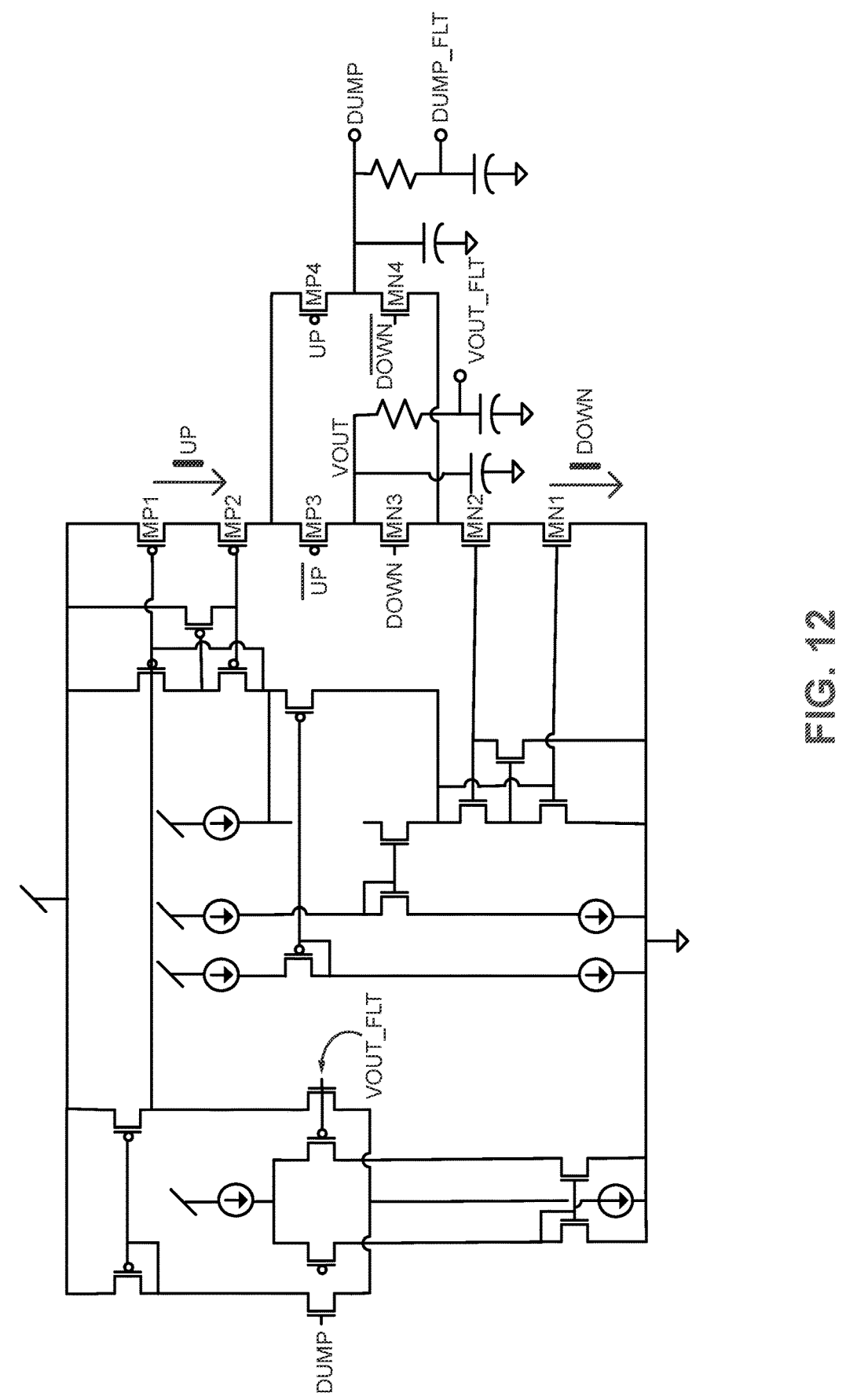
FIG. 12 is an example diagram of a charge pump as discussed herein.

FIG. 12 is an example diagram illustrating a charge pump as discussed herein. The charge pump used is shown in FIG. 12. The design is a common type of charge pump with feedback loops used to set Iup and Idown equal to each other even over the changes in Vout which lead to channel length modulation.

Charge Pump

The charge pump design has it's unique design challenges. For example, the charge pump can introduce error into the delay locked loops if there is:

a mismatch between the UP and DOWN current. Channel length modulation.

charge sharing from switches

23 the charge pump used has feedback loops to match UP and DOWN currents and control channel length modulation.

The switches between UP and DOWN current can introduce error from their mismatch.

Mismatch from the switches creates a large error in the delay locked loop.

Small switch size minimizes charge injection.

Phase Error as change in PFD (phase frequency detector) pulse width due to charge injection and current mismatch:

$$[\Delta \tau]\_PFD = (\partial i\_CP * \tau\_PFD + q\_inj)/i\_CP$$

Even with a good design, there will be a residual error from the mismatch of transistors.

Phase Frequency Detector+Charge Pump Mismatch introduces a phase error into the DLL loops: $\sigma$=17.5 ps For the Gain DLL: phase error contribution would be $\sigma$/16 cells/20 ps resolution=5.4% standard dev of gain error For the Offset DLL: phase error would contribute ~1 code of standard deviation offset error Calibration Loop to Remove the Charge Pump and Phase Frequency Detector mismatch errors.

Figure 13:
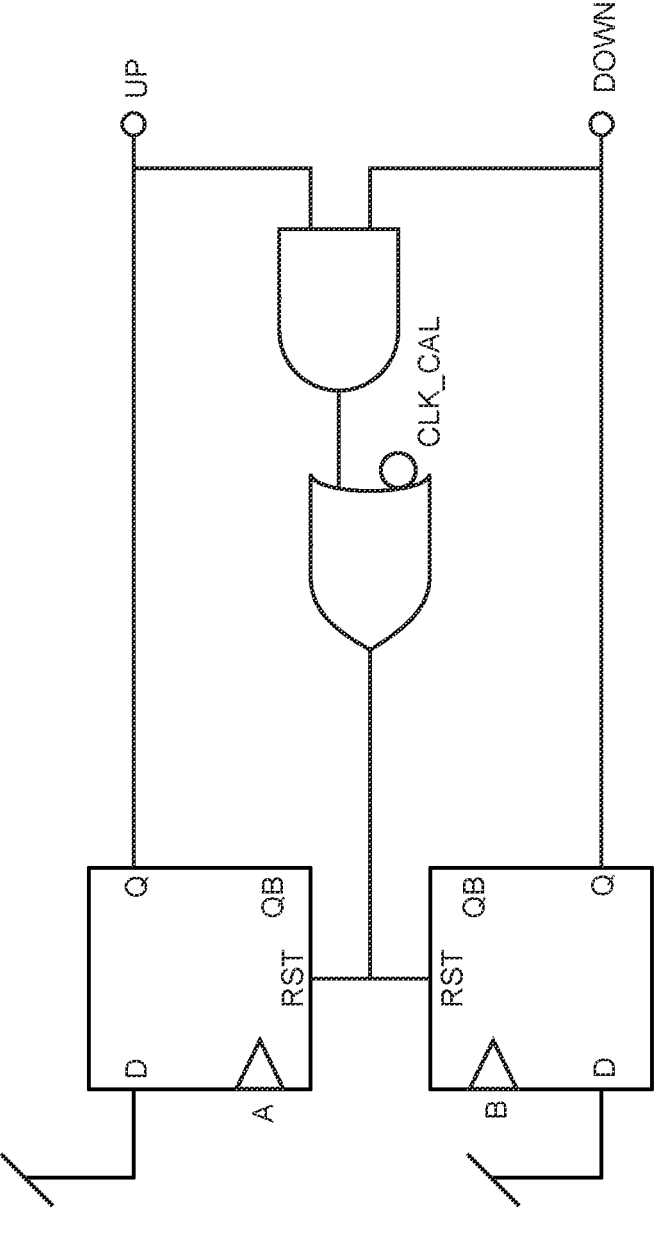
FIG. 13 is an example diagram illustrating an original phase frequency detector as discussed herein.

FIG. 13 is an example diagram illustrating an original phase frequency detector as discussed herein.

Figure 14:
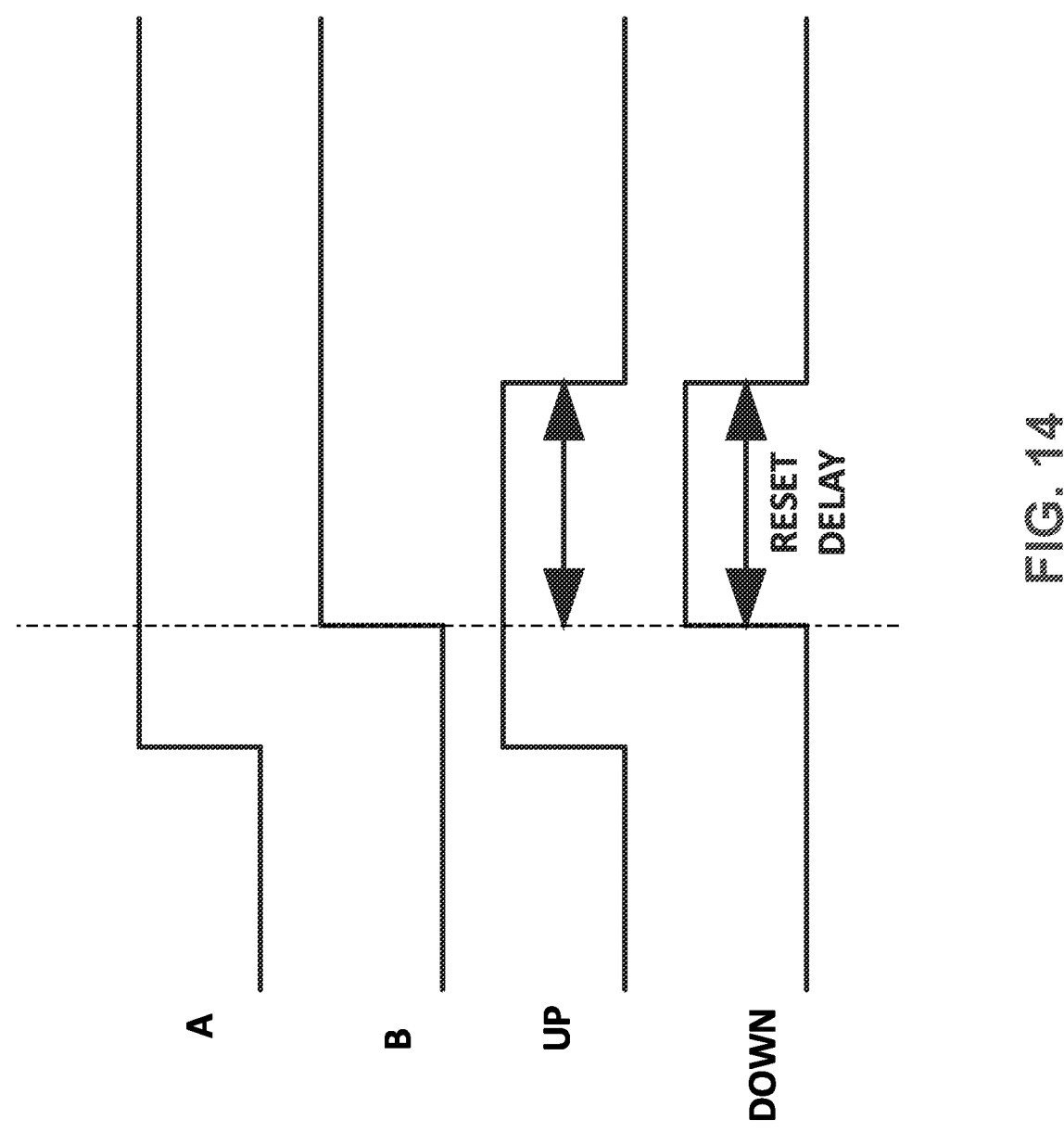
FIG. 14 is an example timing diagram associated with the original phase frequency detector as discussed herein.

One version of PFD (Phase Frequency Detector) logic is shown in FIG. 13. This PFD logic works by switching the UP output high when A goes high, and the DOWN output high when B goes high, when A and B are both high, there is a set delay after which the UP and DOWN outputs are set back to 0. The difference between the A rising edge and B rising edge is the difference of the UP and DOWN pulse widths. The timing associated with PFD is shown in FIG. 14.

Figure 15:
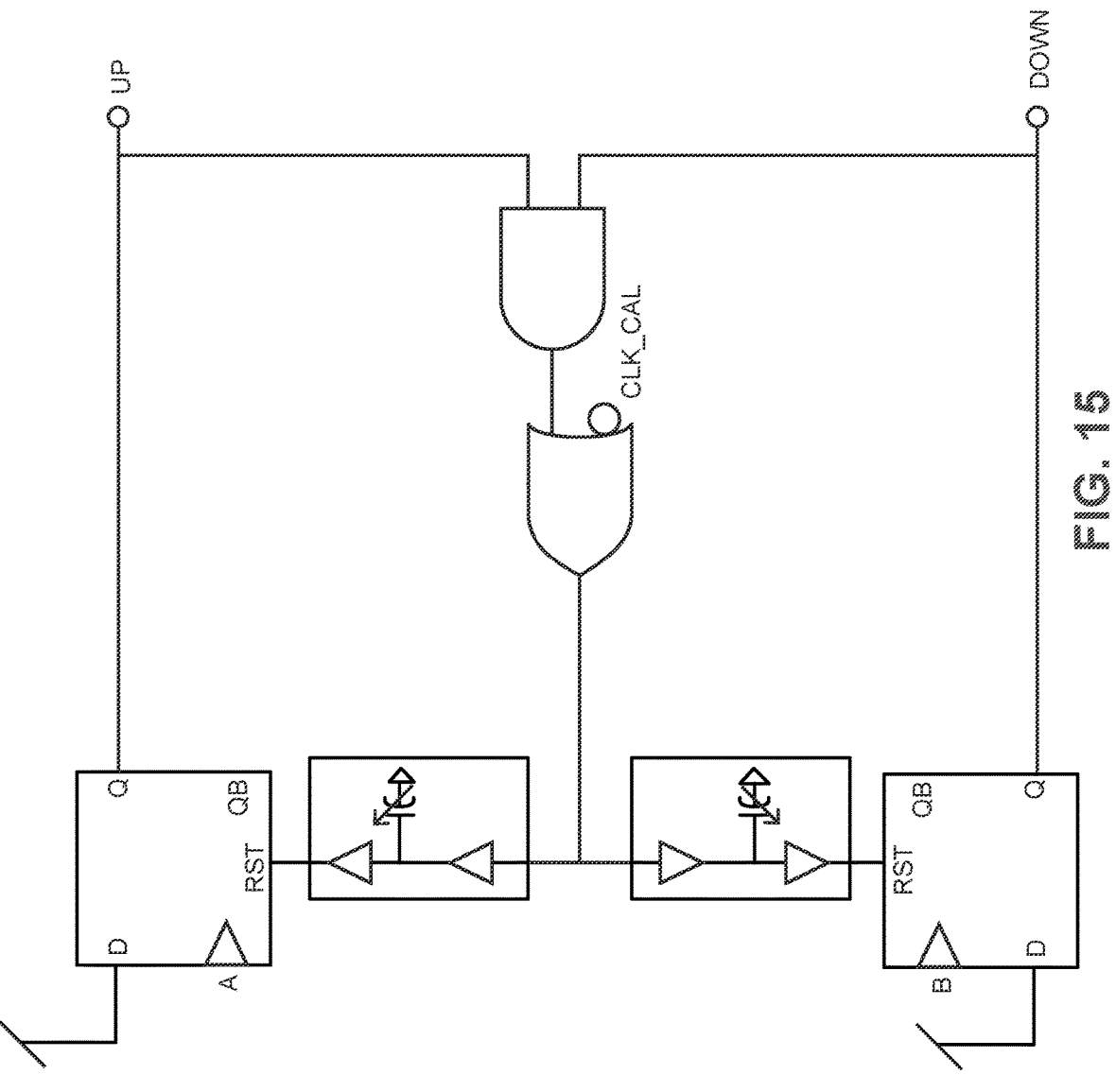
FIG. 15 is an example diagram of a programmable phase frequency detector as discussed herein.

Trimmable Delays are introduced to the reset path of each flip-flop in order to program the individual pulse widths of UP and DOWN pulse as shown in FIG. 15.

Figure 16:
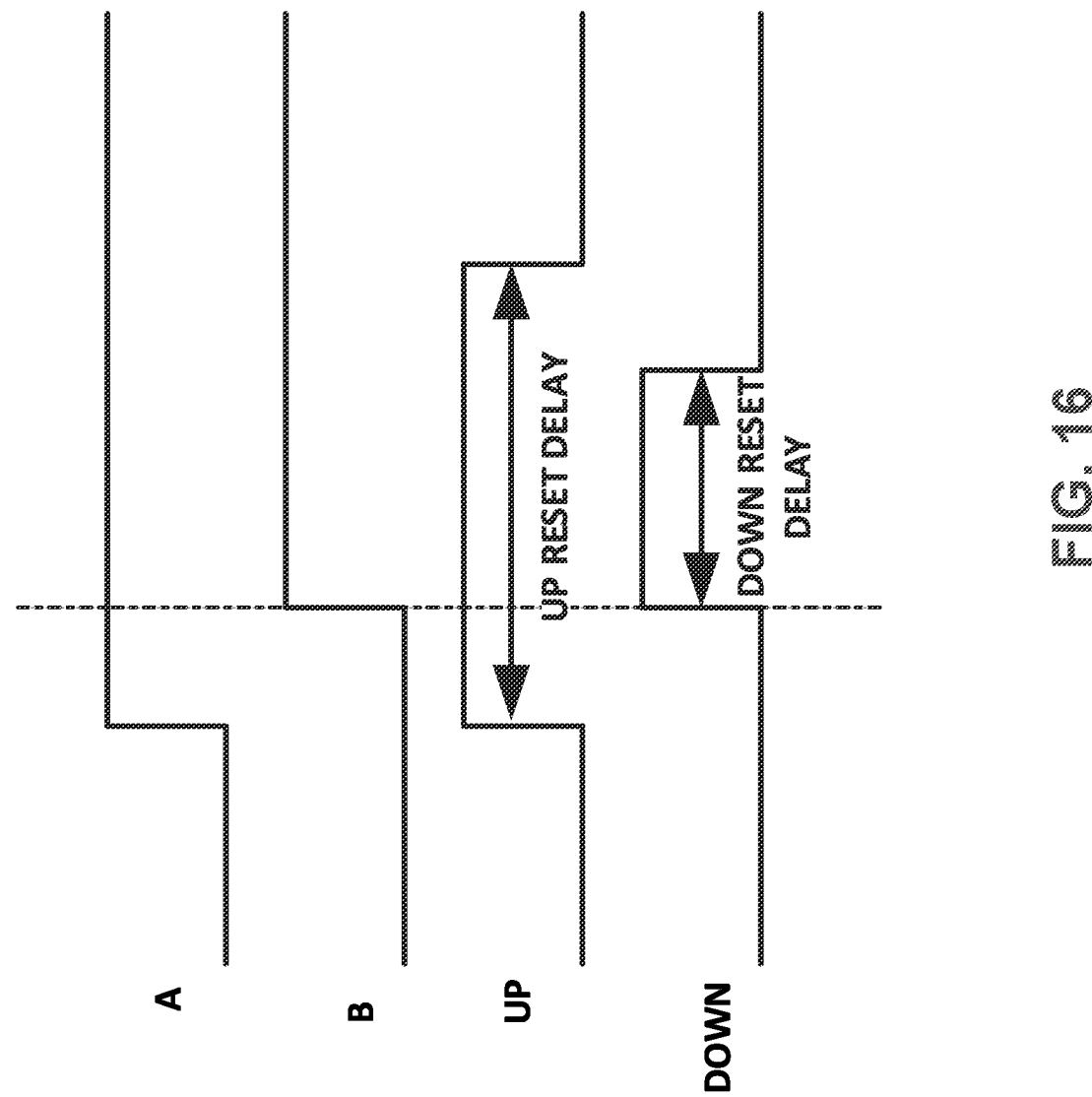
FIG. 16 is an example timing diagram of a programmable phase frequency detector as discussed herein.

FIG. 16 is an example timing diagram illustrating operation of the programmable phase frequency detector as discussed herein.

Figure 17:
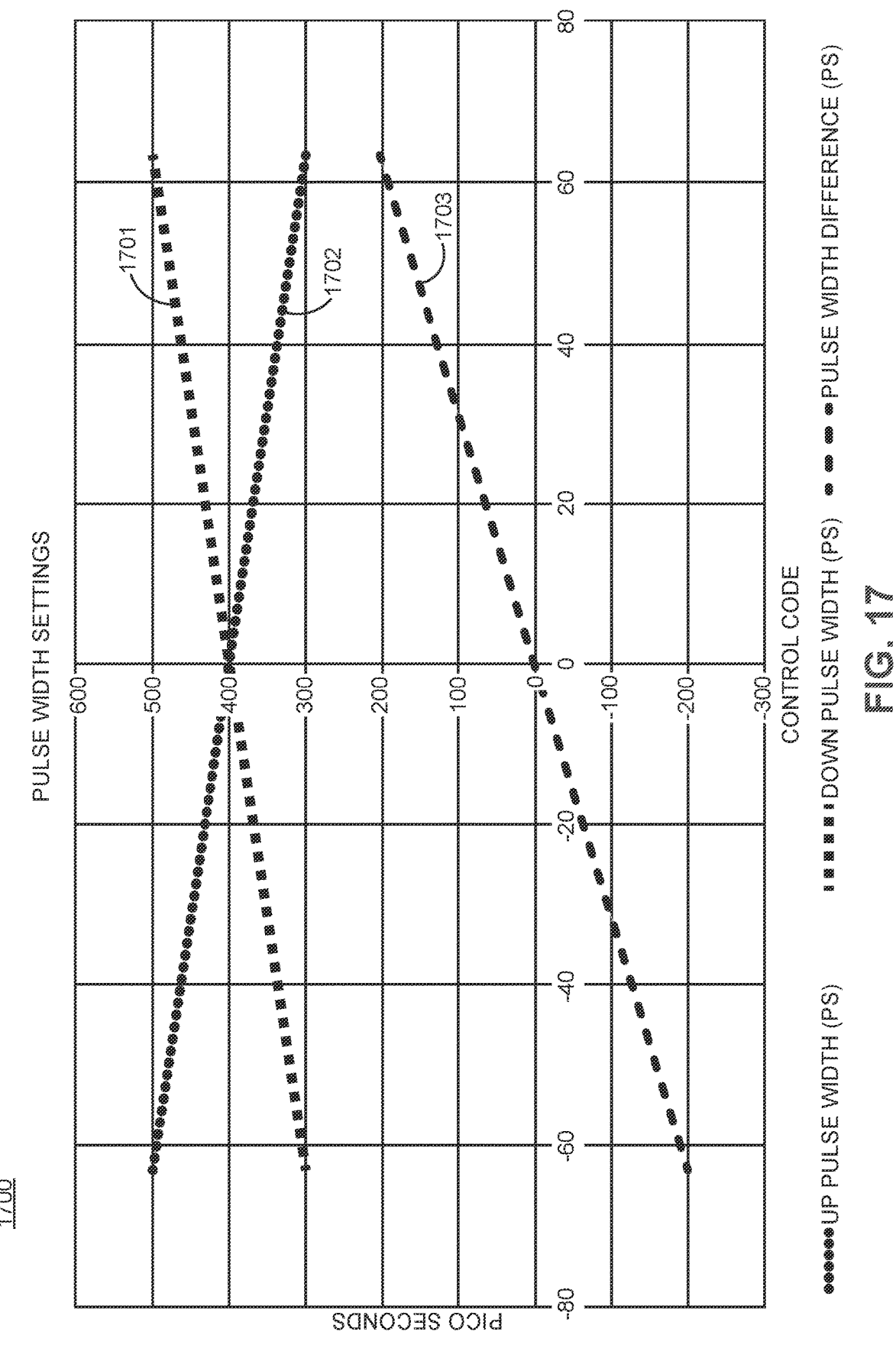
FIG. 17 is an example simulation diagram associated with adjustment of range for an UP pulse and a DOWN pulse as discussed herein.

UP and DOWN pulse are changed one at a time in opposite directions. FIG. 17 shows the difference between UP and DOWN pulse over the full adjustment range. There are 128 adjustments possible.

Offset is updated based on when only the DLFLASH bits vout_bot<0> and vout_top<0> are equal to 1 during offset calibration.

When only vout_bot<0> and vout_top<0> are 1, the offset calibration is complete.

Gain is updated based on when the DLFLASH outputs 5 and −5 during gain calibration In the actual implementation, a large average is taken and then the pulse width is adjusted.

Since the loop is slow, once the pulse width adjustment converges, the values are stored to memory to be reloaded during startup.

FIG. 17 is an example timing diagram illustrating a plot of the pulse width setting (y-axis) versus digital correction control code (x-axis) as discussed herein.

In this example, graph 1700 illustrates a plot of a up pulse width 1701, down pulse width 1702, and corresponding pulse width difference 1703, versus corresponding control code for different pulse width settings. The pulse with different 1703 represents the difference between up pulse with 1701 and down pulse with 1702.

24

Figure 18:
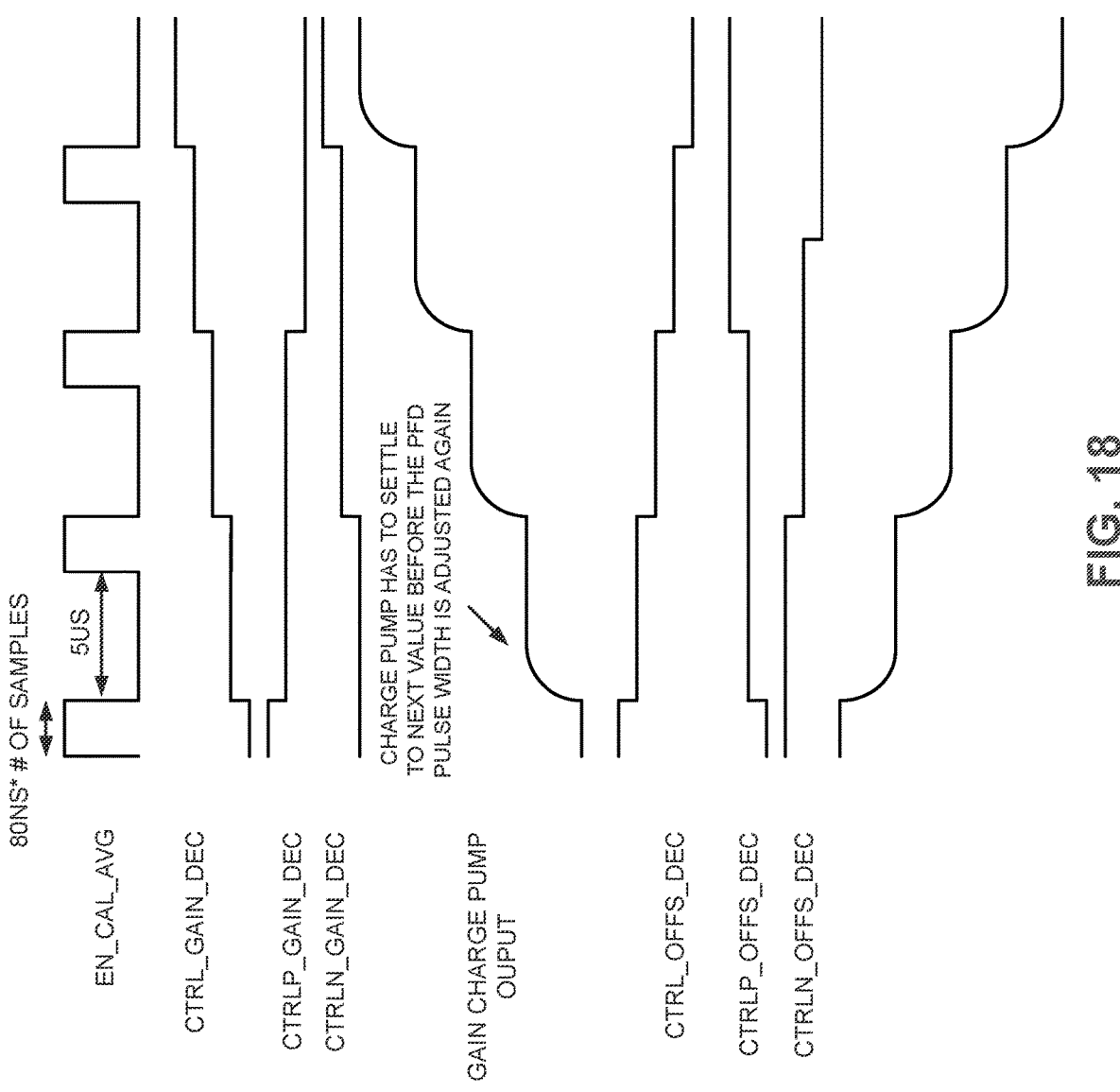
FIG. 18 is an example timing diagram illustrating calibration to remove errors as discussed herein.

The timing of calibration to remove PFD+CP errors are shown in FIG. 18.

During calibration, a large average of the DLFLASH are taken to generate the gain and offset calibration signals.

At the end of the averaging, the gain and offset control signals are updated

A minimum of 5 us wait time is required for the DLLs to settle after the gain and offset control signals are updated before another average can be taken.

FIG. 18 is an example timing diagram of calibrating as discussed herein.

Timing of Calibration to Remove PFD+CP Errors

The charge pump error removal loop described is a slow loop used to remove the mismatch and is crucial to ensure that no additional trim is required and that only 16 cells are needed to digitize 16 mV for all devices. This technique ensures that the DLFLASH can convert in 2.5 ns for all devices. Upon startup, the loop settles the PFD pulse widths after which the values can be stored to memory and reloaded for subsequent startups such that the startup time is fast.

Additional Details of Implementation

Biasing the VTC

The optimal bias point of the CSI changes with mostly temperature and the nmos process variation As shown in FIG. 7, the optimal region of operation changes The faster corners have lower gain from the output of the CSI stage which is desired since the resolution of the delay line will also shrink and vice versa for slow corner Since the NMOS device controls the current through the CSI stage, the adjustment current for the front-end is supplied from a Vgs/R type CTAT bias where Iout=Vgs/R and the NMOS devices can track with process corner together & so the CSI will be near its optimal point $$TC_F = \frac{1}{I_{out}} * \frac{\partial I_{out}}{\partial T} = \frac{1}{V_{gs}} \frac{\partial V_{gs}}{\partial T} - \frac{1}{R} \frac{\partial R}{\partial T}$$

Timing of Tracking ADC

The tracking ADC can operate at 100 Mhz due to the use of an auxiliary DAC to provide a fast feedback path. This idea was a past patent from Mckinley. The auxiliary DAC is the same size and range/resolution as the DLFLASH ADC. It updates immediately after the delay line flash conversion occurs and provides the fast analog feedback path. This feature provides the digital feedback loop an extra clock cycle to update the integrator and compute the next DAC code.

Figure 19:
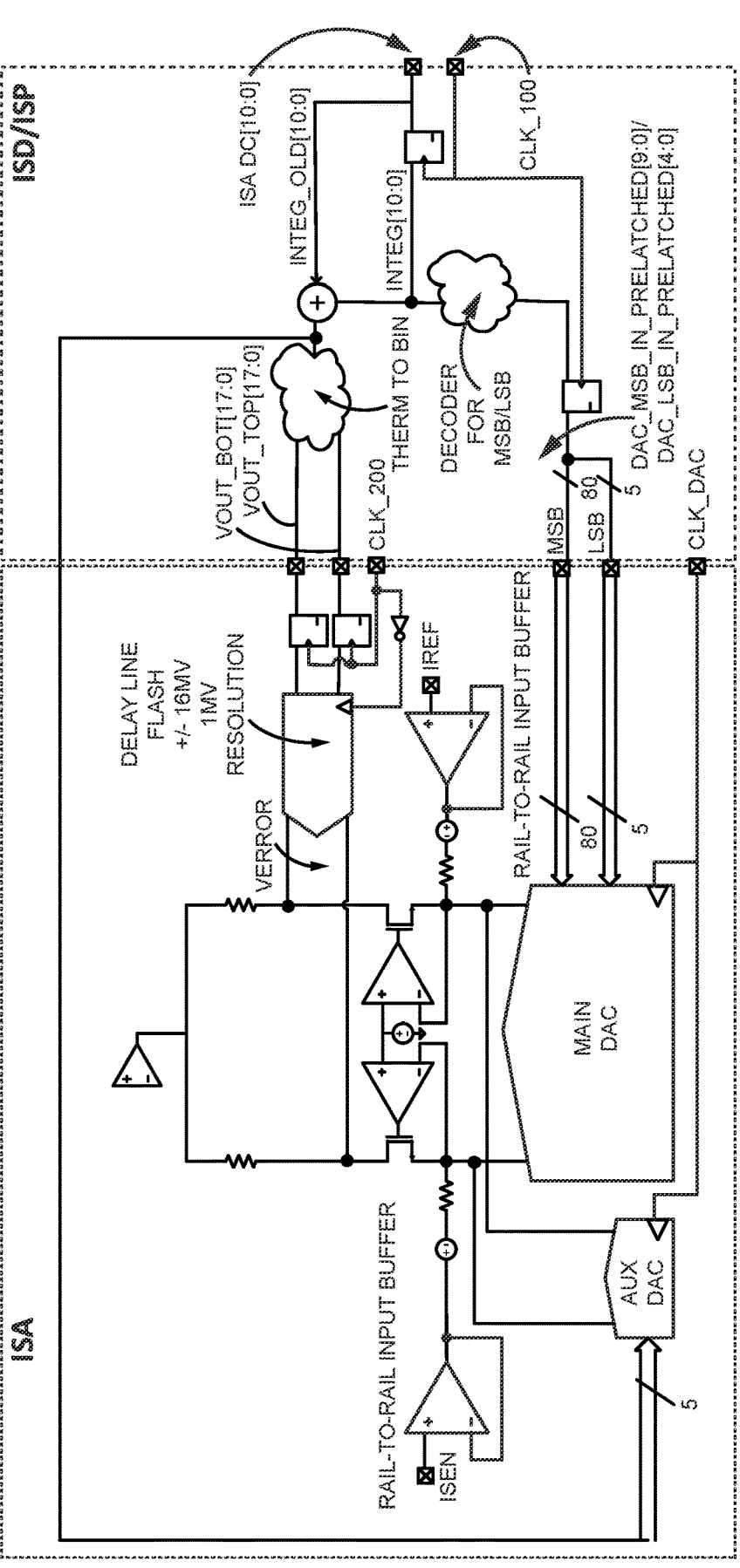
FIG. 19 is an example detailed diagram of a tracking ADC as discussed herein.

In the delay line analog-to-digital converter 110, each flip-flop is a dynamic flip-flop paired with a standard library flip-flop clocked by the opposite cycle clock to form a synchronizer to reduce the probability of metastability. An auxiliary DAC and its feedback path and the synchronizers are shown in FIG. 19.

Figure 20:
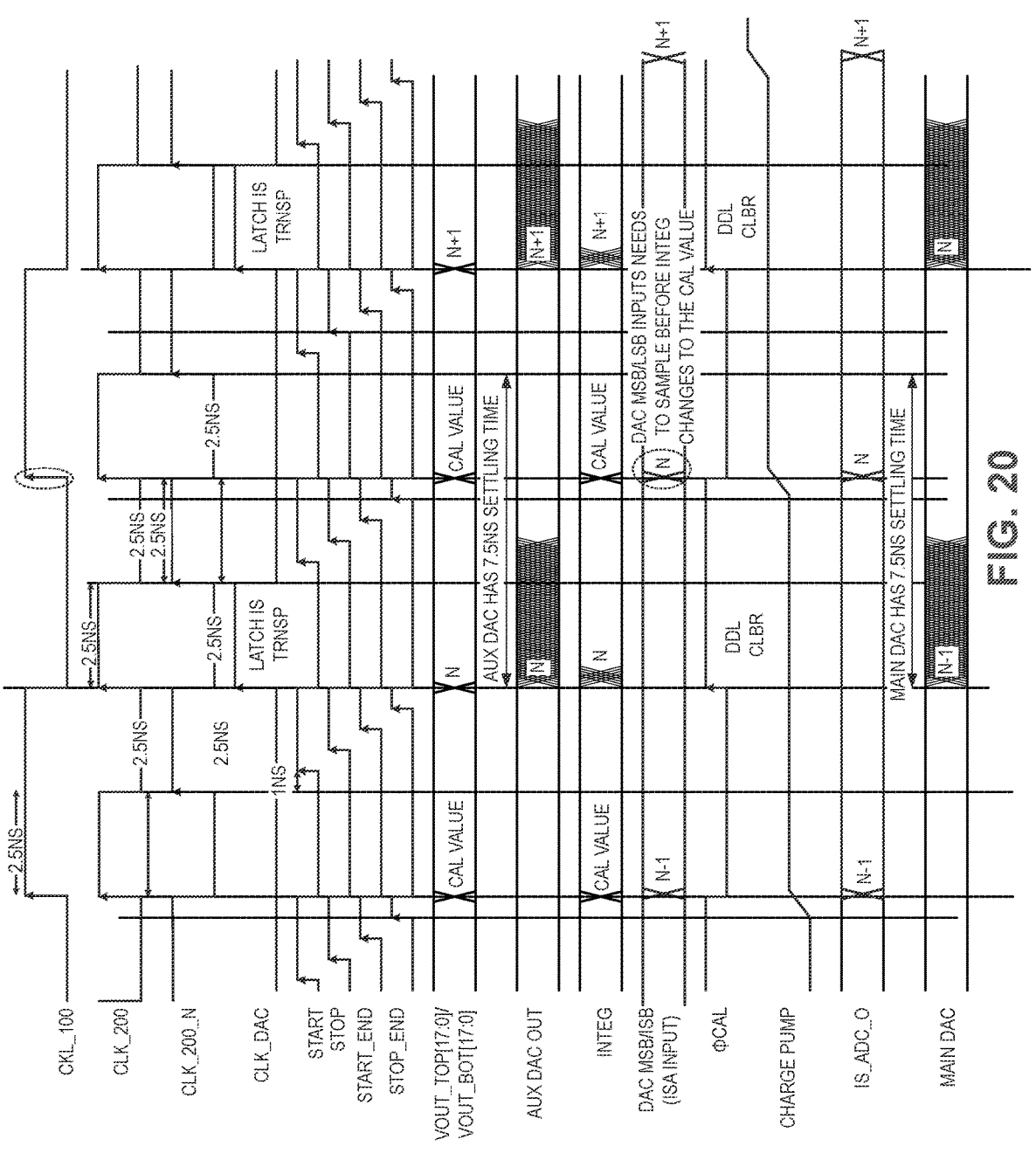
FIG. 20 is an example timing diagram associated with an auxiliary DAC as discussed herein.

FIG. 20 is an example timing diagram illustrating operation of the tracking ADC corresponding complements as discussed herein.

In one embodiment, as shown in FIG. 20, there is an Auxiliary DAC used to update the tracking loop as previously discussed to the immediate value calculated by the DLFLASH (analog-to-digital converter circuitry 110) while the main DAC updates one cycle later. Both Auxiliary DAC and main DIGITAL-TO-ANALOG CONVERTER can be configured to have 7.5 ns of time or other suitable amount to settle.

FIG. 21 is an example delay line ADC including synchronizers as discussed herein.

Yet further, note that an example of the apparatus as discussed herein can be configured to include a synchronizer circuit 2100. The synchronizer circuit as discussed herein is operative to adjust a clock signal applied to D flip-flops disposed in the delay line analog-to-digital converter circuitry.

Figure 21A:
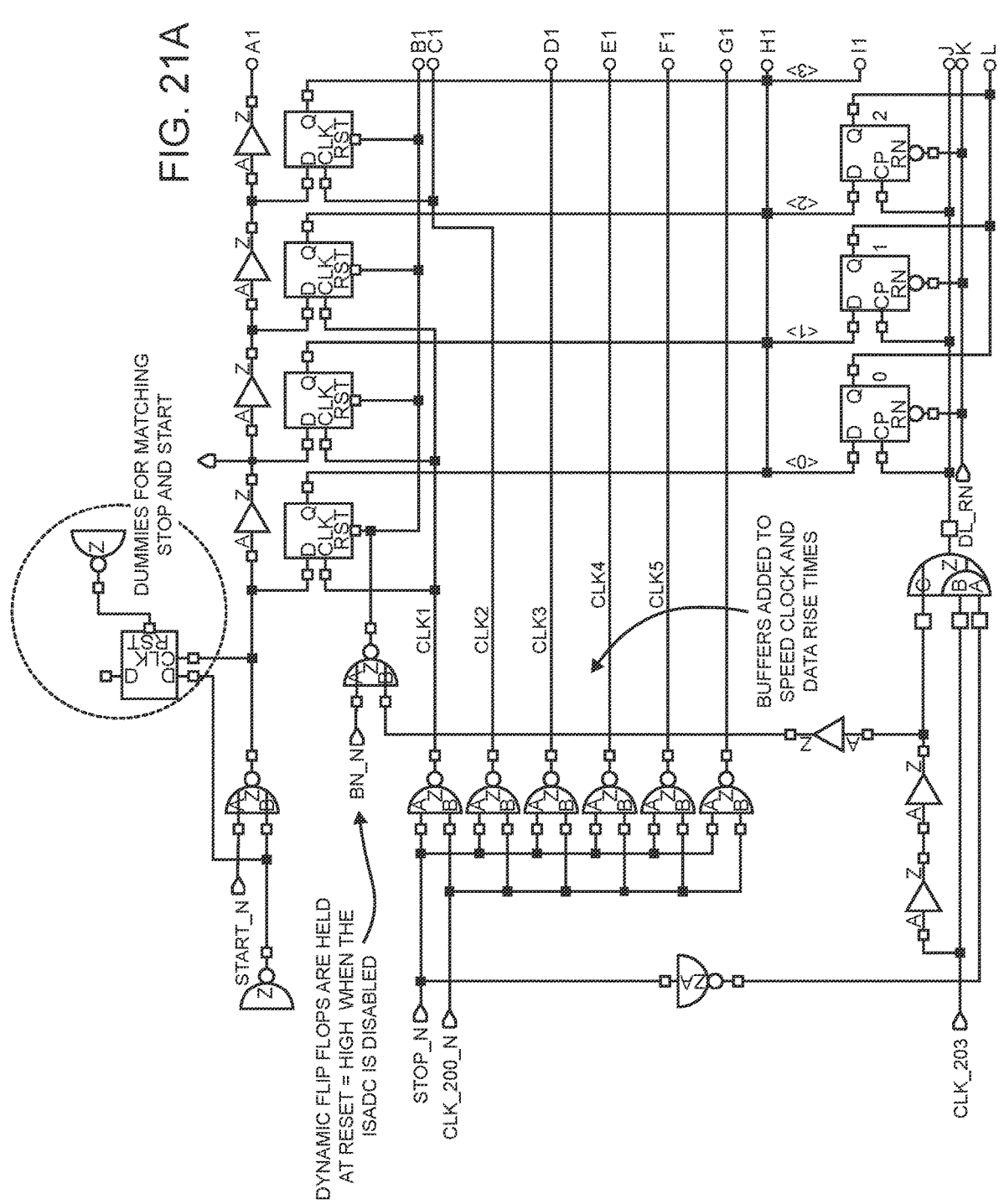
Figure 21C:
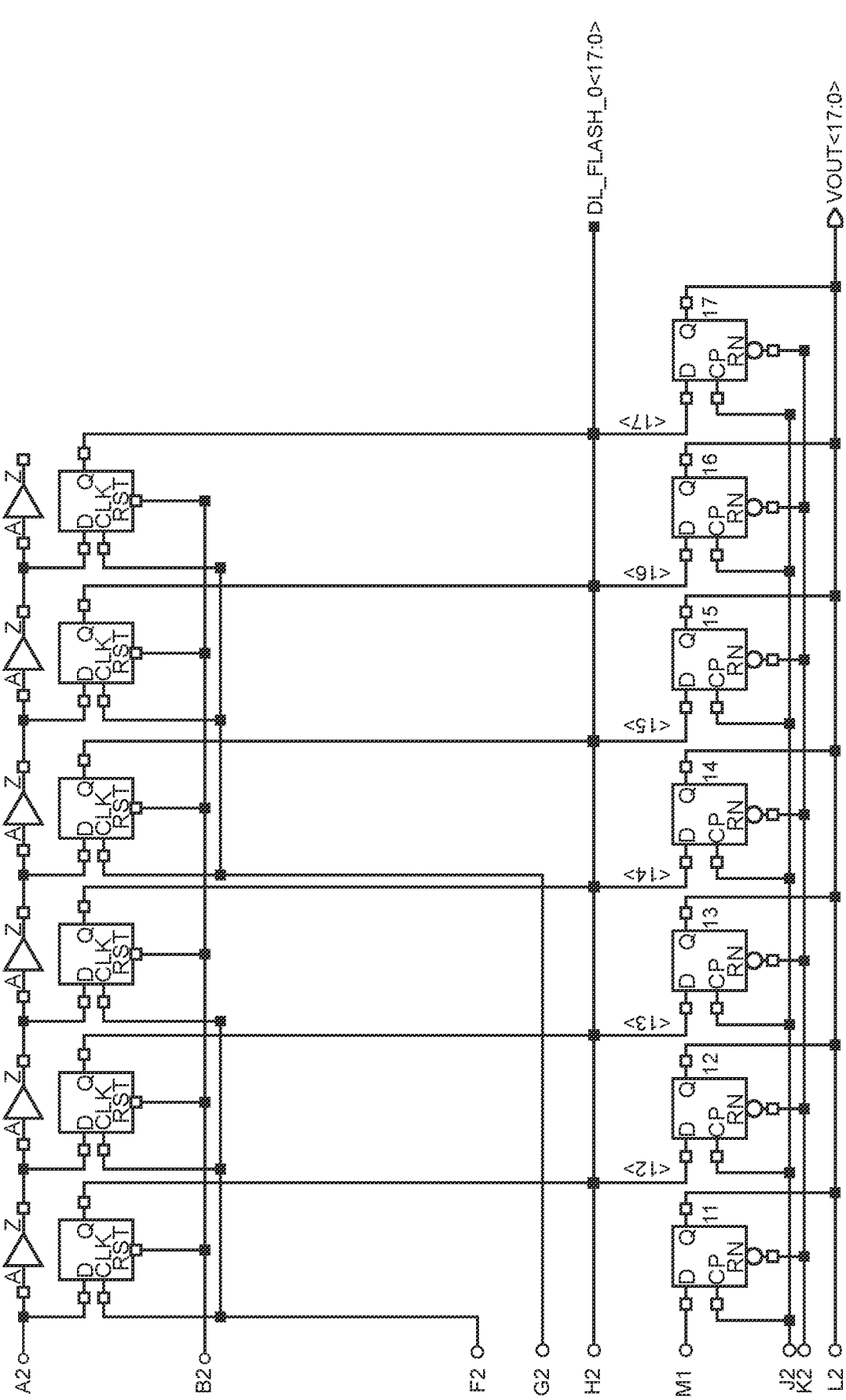

The delay line schematic is shown in a combination of FIGS. 21A, 21B, and 21C. Each dynamic flip-flop is paired with a standard flip-flop clocked by the opposite clock cycle to form a synchronizer pair.

clk_200 can force the stop clock signal. Synchronizers are clocked based on a delayed clk_200 which occurs after the dynamic flip-flops generate an output in case of a forced clk_200 stop signal Delay line has 16 unary cells to convert time to digital code $\delta\sim=20$ ps$\rightarrow$resolution of delay line FIG. 22 is an example diagram illustrating a method as discussed herein.

As shown in flowchart 2200 (method), in processing operation 2210, the voltage to time converter 210 (also known as a signal generator) receives an analog voltage across nodes vinn and vinp of the amplifier A1.

In processing operation 2220, the voltage to time converter 210 produces control signals 105 at nodes voutp and voutn to control operation of the delay line analog-to-digital converter circuitry 110 based upon the analog voltage received across nodes vinn and vinp by the voltage to time converter 210 (signal generator circuit). As previously discussed, the delay line analog-to-digital converter circuitry 110 is operative to convert samples of the analog voltage received at across nodes vinn and vinp into a digital signal.

In processing operation 2230, the calibration circuitry (such as offset calibration circuit 221 and/or gain calibration circuit 222) calibrates the signal generator circuit (voltage to time converter 210) based on calibration feedback (such as output 499 which is used by the gain calibration circuit 222 to produce the gain adjustment control signal G1 or monitored voltages at nodes N41 and N42 which are used by the offset calibration circuit 221 to produce the offset adjustment control signal J1) generated via conversion of the analog voltage (such as) into the digital signal by the delay line analog-to-digital converter circuitry 110.

Note again that techniques herein are well suited for use in circuit applications such as those that implement compensation in a power converter. However, it should be noted that examples herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred examples thereof, it will be understood by those skilled in the art that various changes in form and details may be made therein without departing from the spirit and scope of the present application as defined by the appended claims. Such variations are intended to be covered by the scope of this present application. As such, the foregoing description of examples of the present application is not intended to be limiting. Rather, any limitations to the invention are presented in the following claims.

The invention claimed is:

1. An apparatus comprising:
   delay line analog-to-digital converter circuitry;
   a signal generator circuit coupled to the delay line analog-to-digital converter circuitry, the signal generator circuit operative to produce control signals to control operation of the delay line analog-to-digital converter circuitry based upon an analog voltage received by the signal generator circuit, wherein the signal generator circuit is a voltage-to-time converter, wherein the control signals include a first control signal and a second control signal supplied to the delay line analog-to-digital converter circuitry, a magnitude of a time duration between the first control signal and the second control signal depending on a magnitude of the received analog voltage; and
   calibration circuitry operative to calibrate the signal generator circuit based on calibration feedback.

2. The apparatus as in claim 1, wherein the delay line analog-to-digital converter circuitry includes a first delay line analog-to-digital converter circuit and a second delay line analog-to-digital converter disposed in parallel to convert the received analog voltage into corresponding samples of digital output signals.

3. The apparatus as in claim 2, wherein the first delay line analog-to-digital converter circuit is operative to generate a first portion of the corresponding samples for a first condition in which a magnitude of the analog voltage is greater than a threshold level; and wherein the second delay line analog-to-digital converter circuit is operative to generate a second portion of the corresponding samples during a second condition in which a magnitude of the analog voltage is less than the threshold level.

4. The apparatus as in claim 2, wherein the first control signal is operative to control a start operation of the first delay line analog-to-digital converter circuit;

wherein the second control signal is operative to control a stop operation of the first delay line analog-to-digital converter circuit;

wherein the second control signal is operative to control a start operation of the second delay line analog-to-digital converter circuit; and wherein the first control signal is operative to control a stop operation of the second delay line analog-to-digital converter circuit.

5. The apparatus as in claim 2 further comprising:

selector circuitry disposed at an output of the delay line analog-to-digital converter circuitry, the selector circuitry operative to select between a first signal generated by the first delay line analog-to-digital converter circuit and a second signal generated by the second delay line analog-to-digital converter circuit.

6. The apparatus as in claim 1, wherein the delay line analog-to-digital converter circuitry is implemented in a tracking analog-to-digital converter circuit, the delay line analog-to-digital converter circuitry operative to convert the analog voltage into a first digital signal indicating a magnitude of the analog voltage.

7. The apparatus as in claim 6, wherein the analog voltage is a first analog voltage; and wherein the first analog voltage is an analog error voltage representing a difference between an analog input voltage and a second analog voltage, the second analog voltage derived by a digital to analog converter from a second digital signal, the second digital signal derived from the first digital signal.

8. The apparatus as in claim 7, wherein the second digital signal indicates a magnitude of the analog input voltage.

9. The apparatus as in claim 6, wherein the calibration circuitry includes a gain calibration loop, a gain associated with the delay line analog-to-digital converter circuitry configured to match a gain setting of a tracking loop associated with the tracking analog-to-digital converter circuit.

10. The apparatus as in claim 1, wherein the signal generator circuit includes an amplifier operative to receive the analog voltage;

wherein the calibration circuitry includes an offset calibration circuit operative to monitor the control signals inputted to the delay line analog-to-digital converter circuitry; and wherein the offset calibration circuitry is operative to generate an offset adjustment control signal based on the monitored control signals inputted to the delay line analog-to-digital converter circuitry, the offset adjustment control signal operative to adjust an offset associated with the amplifier.

11. The apparatus as in claim 10, wherein the offset calibration circuitry is an offset delay locked loop circuit.

12. The apparatus as in claim 1, wherein the signal generator circuit includes an amplifier operative to receive the analog voltage;

wherein the calibration circuitry includes a gain calibration circuit operative to monitor an output of the delay line analog-to-digital converter circuitry; and wherein the gain calibration circuitry is operative to generate a gain adjustment control signal based on the output, the gain adjustment control signal operative to adjust a gain associated with the amplifier converting the received analog voltage into the control signals.

13. The apparatus as in claim 12, wherein the gain calibration circuitry is a gain delay locked loop circuit.

14. The apparatus as in claim 1, wherein the delay line analog-to-digital converter circuitry includes:

a first delay line analog-to-digital converter operative to generate positive error values associated with conversion of the analog voltage into a digital signal; and a second delay line analog-to-digital converter operative to generate negative error values associated with conversion of the analog voltage into the digital signal.

15. The apparatus as in claim 1, wherein the calibration circuitry is operative to calibrate the voltage-to-time converter based on the calibration feedback; and wherein the calibration feedback is received from monitoring the control signals and digital signals, the digital signals outputted from the delay line analog-to-digital converter circuitry.

16. The apparatus as in claim 1 further comprising:

a selector circuit operative to select amongst multiple inputs including: i) a first analog gain reference voltage, ii) a second analog gain reference voltage, iii) an offset reference voltage, and iv) and an analog error voltage.

17. The apparatus as in claim 16, wherein the calibration circuitry is operative to produce the calibration feedback based on sample conversions of the first analog gain reference voltage, the second analog gain reference voltage, and the offset reference voltage at different times during an analog-to-digital converter cycle of operating the delay line analog-to-digital converter circuitry.

18. The apparatus as in claim 17, wherein the selector circuit is operative to interleave conversion of the analog error voltage amongst conversions of the first analog gain reference voltage, the second analog gain reference voltage, and the offset reference voltage.

19. The apparatus as in claim 1 further comprising:

a synchronizer circuit operative to adjust a clock signal applied to D flip-flops disposed in the delay line analog-to-digital converter circuitry.

20. A method apparatus comprising:

receiving an analog voltage;

via a signal generator circuit, producing control signals to control operation of delay line analog-to-digital converter circuitry based upon the analog voltage received by the signal generator circuit, the control signals including a first control signal and a second control signal supplied to the delay line analog-to-digital converter circuitry, a magnitude of a time duration between the first control signal and the second control signal depending on a magnitude of the received analog voltage, the delay line analog-to-digital converter circuitry operative to convert samples of the analog voltage into a digital signal; and calibrating the signal generator circuit based on calibration feedback generated via conversion of the samples of the analog voltage into digital signals via the delay line analog-to-digital converter circuitry.

21. An apparatus comprising:

a delay line analog-to-digital converter operable to convert an analog error voltage into a digital error voltage signal based on a first control signal and a second control signal supplied to the delay line analog-to-digital converter, a magnitude of a time duration between the first control signal and the second control signal depending on a magnitude of the analog error voltage;

an integrator function operable to produce a digital value representative of an analog input voltage, the digital value adjusted based on samples of the digital error voltage signal generated by the delay line analog-to-digital converter; and a digital-to-analog converter operative to convert the digital value received from the integrator function into a second analog voltage, the analog error voltage being a difference between the input voltage and the second analog voltage.

22. The apparatus as in claim 1, wherein the calibration circuitry includes gain calibration circuitry and offset calibration circuitry;

wherein the offset calibration circuitry includes a first set of charge pumps to produce an offset calibration signal supplied to the signal generator circuit;

wherein the gain calibration circuitry includes a second set of charge pumps to produce a gain calibration signal supplied to the signal generator circuit;

the apparatus further comprising:

first pulse width calibration circuitry operative to adjust pulse widths of first pulse width modulation signals applied to the first set of charge pumps and phase frequency detector to calibrate the first set of charge pumps and phase frequency detector based on an output of the delay line analog-to-digital converter circuitry;

wherein the adjustment of the pulse widths of the first pulse width modulation signals reduces charge pump error and phase frequency detector error associated with the first set of charge pumps and phase frequency detector;

second pulse width calibration circuitry operative to adjust pulse widths of second pulse width modulation signals applied to the second set of charge pumps and phase frequency detector to calibrate the second set of charge pumps and phase frequency detector based on the output of the delay line analog-to-digital converter circuitry; and wherein the adjustment of the pulse widths of the second pulse width modulation signals reduces charge pump error and phase frequency detector error associated with the second set of charge pumps and phase frequency detector.

23. The apparatus as in claim 1, wherein first D flip-flops in the first delay line analog-to-digital converter circuitry and second D flip-flops in the second delay line analog-to-digital converter circuitry are implemented with a negative setup time to provide overlap with respect to producing the digital output signal around the threshold level.

24. The apparatus as in claim 1, wherein the delay line analog-to-digital converter circuitry includes a first delay line analog-to-digital converter circuit and a second delay line analog-to-digital converter circuit to convert the analog voltage into corresponding samples of digital output signals.

25. The apparatus as in claim 24, wherein the first delay line analog-to-digital converter is operative to generate positive error values associated with conversion of the analog voltage into a digital signal; and wherein the second delay line analog-to-digital converter operative to generate negative error values associated with conversion of the analog voltage into the digital signal.

26. The apparatus as in claim 1 further comprising:

selector circuitry disposed at an output of the delay line analog-to-digital converter circuitry, the selector circuitry operative to select between a first output signal generated by the first delay line analog-to-digital converter circuit and a second output signal generated by the second delay line analog-to-digital converter circuit to produce the digital output indicating the magnitude of the received input voltage.

27. The apparatus as in claim 1, wherein the calibration circuitry includes a gain calibration loop, a gain associated with the delay line analog-to-digital converter circuitry configured to match a gain setting of a tracking loop associated with the analog-to-digital converter circuitry.

* * * * *